(12) United States Patent
Lee et al.

(10) Patent No.: US 11,784,458 B2
(45) Date of Patent: Oct. 10, 2023

(54) SURFACE-EMITTING LASER PACKAGE

(71) Applicant: SUZHOU LEKIN SEMICONDUCTOR CO., LTD., Taicang (CN)

(72) Inventors: Ba Ro Lee, Seoul (KR); Myung Sub Kim, Seoul (KR); Baek Jun Kim, Seoul (KR); Ki Bum Sung, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 764 days.

(21) Appl. No.: 16/633,889

(22) PCT Filed: Aug. 16, 2018

(86) PCT No.: PCT/KR2018/009374
§ 371 (c)(1),
(2) Date: Jan. 24, 2020

(87) PCT Pub. No.: WO2019/035653
PCT Pub. Date: Feb. 21, 2019

(65) Prior Publication Data
US 2020/0220324 A1 Jul. 9, 2020

(30) Foreign Application Priority Data

Aug. 18, 2017 (KR) .................. 10-2017-0104746
Apr. 6, 2018 (KR) .................. 10-2018-0040295

(51) Int. Cl.
*H01S 5/02257* (2021.01)
*H01S 5/42* (2006.01)
(Continued)

(52) U.S. Cl.
CPC ........ *H01S 5/02257* (2021.01); *G02B 5/0215* (2013.01); *G02B 5/0263* (2013.01);
(Continued)

(58) Field of Classification Search
CPC ........ H01S 5/02257; H01S 5/42; H01S 5/423; G02B 5/0215; G02B 5/0263
See application file for complete search history.

(56) References Cited

U.S. PATENT DOCUMENTS 9,184,343 B2    11/2015  Yoo et al.
9,825,425 B2 *  11/2017  Mor .................. G01B 11/2513
(Continued)

FOREIGN PATENT DOCUMENTS

JP    3463613 B2   11/2003
JP    2005-49367 A  2/2005
(Continued)

OTHER PUBLICATIONS

Korean Decision to Grant a Patent issued in Korean Patent Applicaiion No. 10-2022-0170393, dated Jul. 26, 2023.

*Primary Examiner* — Yuanda Zhang
(74) *Attorney, Agent, or Firm* — Birch, Stewart, Kolasch & Birch, LLP

(57) ABSTRACT

A surface-emitting laser package comprises: a substrate; a surface-emitting laser device disposed on the substrate, and having a non-emitting area and an emitting area which includes a plurality of emitters each generating a first laser beam; a housing disposed around the surface-emitting laser device; and a diffusing part disposed on the surface-emitting laser device. The emitting area has a first width in a first direction and a second width in a second direction perpendicular to the first direction, and the second width may be greater than the first width. The diffusing part outputs the first laser beam into a second laser beam having a first angle of view in the first direction and a second angle of view in the second direction, and the first angle of view may be greater than the second angle of view.

15 Claims, 14 Drawing Sheets

(51) Int. Cl.
*G02B 5/02* (2006.01)
*H01S 5/02345* (2021.01)

(52) U.S. Cl.
CPC ............... *H01S 5/42* (2013.01); *H01S 5/423* (2013.01); *H01S 5/02345* (2021.01)

(56) References Cited

U.S. PATENT DOCUMENTS

| | | | |
|---|---|---|---|
| 10,361,180 B2 | 7/2019 | Rogers et al. | |
| 2005/0024746 A1 | 2/2005 | Shimura | |
| 2007/0058904 A1* | 3/2007 | Ban | G02B 6/4204 385/52 |
| 2009/0296762 A1 | 12/2009 | Yamaguchi | |
| 2010/0232465 A1 | 9/2010 | Tsukiji et al. | |
| 2011/0216523 A1 | 9/2011 | Tong et al. | |
| 2011/0291135 A1 | 12/2011 | Hsieh et al. | |
| 2014/0355125 A1* | 12/2014 | Boyd | G02B 5/0257 359/599 |
| 2015/0286018 A1 | 10/2015 | Lee et al. | |
| 2017/0350581 A1 | 12/2017 | Balimann et al. | |
| 2018/0045395 A1 | 2/2018 | Kamada | |

FOREIGN PATENT DOCUMENTS

| | | |
|---|---|---|
| JP | 2011-44610 A | 3/2011 |
| JP | 2011-86914 A | 4/2011 |
| KR | 10-0808644 B1 | 2/2008 |
| KR | 10-2009-0124970 A | 12/2009 |
| KR | 10-0960099 B1 | 5/2010 |
| KR | 10-2012-0127184 A | 11/2012 |
| KR | 10-2013-0037201 A | 4/2013 |
| KR | 10-2013-0117572 A | 10/2013 |
| KR | 10-1361913 B1 | 2/2014 |
| KR | 10-2015-0008439 A | 1/2015 |
| KR | 10-2015-0064413 A1 | 6/2015 |
| KR | 10-2015-0109591 A | 10/2015 |
| KR | 10-2015-0116707 A | 10/2015 |
| KR | 10-2015-0133048 A | 11/2015 |
| KR | 10-2016-0076606 A | 7/2016 |
| WO | WO 2016/143682 A1 | 9/2016 |

* cited by examiner

SURFACE-EMITTING LASER PACKAGE

CROSS REFERENCE TO RELATED APPLICATIONS

This application is the National Phase of PCT/KR2018/009374 filed on Aug. 16, 2018, which claims priority under 35 U.S.C. § 119(a) to Patent Application Nos. 10-2017-0104746 and 10-2018-0040295 filed in the Republic of Korea on Aug. 18, 2017 and Apr. 6, 2018, respectively, all of which are hereby expressly incorporated by reference into the present application.

TECHNICAL FIELD

An embodiment relates to a surface-emitting laser package.

BACKGROUND ART

A surface-emitting laser including compounds such as GaN, AlGaN, and the like can have many advantages such as wide and easily adjustable band gap energy and the like and can be variously used for light emitting elements, light receiving elements, and various diodes.

In particular, a surface-emitting laser package using a compound semiconductor material including a Group III-V element or a Group II-VI element may be employed in optical communication, sensors, autofocusing devices, proximity sensors, and autofocusing devices.

A diffuser is provided for diffusing light into the surface-emitting laser. However, in the related art, there is a problem that light is absorbed by the diffuser and the light output is lowered.

In a conventional surface-emitting laser package, a diffuser is attached to a housing by using an adhesive member. In such a case, there is a problem that the adhesive member penetrates into the inside along one surface of the diffuser to cause light loss.

SUMMARY

An embodiment is directed to solving the above problems and other problems.

Another object of the embodiment is to provide a surface-emitting laser package having a new structure.

Still another object of the embodiment is to provide a surface-emitting laser package capable of improving light output.

Still another object of the embodiment is to provide a surface-emitting laser package for preventing light loss.

According to one aspect of an embodiment, a surface-emitting laser package includes: a substrate; a surface-emitting laser device disposed on the substrate and having a non-light emitting region and a light emitting region including a plurality of emitters generating a first laser beam, respectively; a housing disposed around the surface-emitting laser device; and a diffusing part disposed on the surface-emitting laser device. The light emitting region has a first width in a first direction and a second width in a second direction perpendicular to the first direction, and the second width may be larger than the first width. The diffusing part outputs the first laser beam as a second laser beam having a first viewing angle in the first direction and a second viewing angle in the second direction, and the first viewing angle may be larger than the second viewing angle.

According to another aspect of the embodiment, a surface-emitting laser package includes: a substrate; a surface-emitting laser disposed on the substrate; a housing disposed on the substrate and disposed around the surface-emitting laser; a first plate disposed on the housing and spaced apart from the surface-emitting laser; an adhesive member disposed between the housing and the first plate; and a pattern array disposed on one side of the first plate facing the surface-emitting laser. The pattern array may be disposed to be spaced apart from an inner surface of the housing. A height of the pattern array may be formed to be smaller than a half value of a distance between a surface-emitting laser device and a diffusing part. A width of the pattern array may be larger than a light emitting region of the surface-emitting laser.

Advantageous Effects

Effects of a surface-emitting laser package according to an embodiment will be described as follows.

According to at least one of the embodiments, there is an advantage that light output may be improved by modifying a shape of a diffusion plate so as to be optimized to the shape according to a shape of a light emitting region of a surface-emitting laser device.

According to the surface-emitting laser package according to the embodiment, there is an effect that it is possible to prevent an adhesive layer from spreading within a beam viewing angle by disposing a diffusion pattern portion spaced apart from the inside of a housing.

According to the surface-emitting laser package according to the embodiment, there is an effect that light loss may be prevented by forming the diffusion pattern portion within a range of the beam viewing angle generated by the surface-emitting laser.

According to the surface-emitting laser package according to the embodiment, there is an effect that it is possible to reduce spreading of the adhesive layer by making surface tension of the diffusing part of the diffusion pattern portion different.

According to the surface-emitting laser package according to the embodiment, there is an effect that it is possible to reduce spreading of the adhesive layer by controlling an inclination angle between a side surface of the diffusion pattern portion and a lower surface of the diffusing part.

According to the surface-emitting laser package according to the embodiment, there is an effect that it is possible to reduce spreading of the adhesive layer by forming a protrusion between the housing and the diffusing part.

Additional scope of applicability of the embodiments will be apparent from following detailed descriptions. However, since various changes and modifications within the spirit and scope of the embodiments may be clearly understood by those skilled in the art, it should be understood that specific embodiments such as the detailed descriptions and the preferred embodiments are given merely as examples.

DETAILED DESCRIPTION

Hereinafter, embodiments of the present invention will be described in detail with reference to the accompanying drawings. However, the spirit and scope of the present embodiment is not limited to a part of the embodiments described, and may be implemented in various other forms, and within the spirit and scope of the present invention, one or more of the elements of the embodiments may be selectively combined and replaced. In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (A, and (b) may be used. These terms are only used to distinguish the elements from other elements, and the terms are not limited to the essence, order, or order of the elements. In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements. Further, when described as being formed or disposed "on (over)" or "under (below)" of each element, the "on (over)" or "under (below)" may include not only when two elements are directly connected to each other, but also when one or more other elements are formed or disposed between two elements. Furthermore, when expressed as "on (over)" or "under (below)", it may include not only the upper direction but also the lower direction based on one element.

First Embodiment

Figure 1:
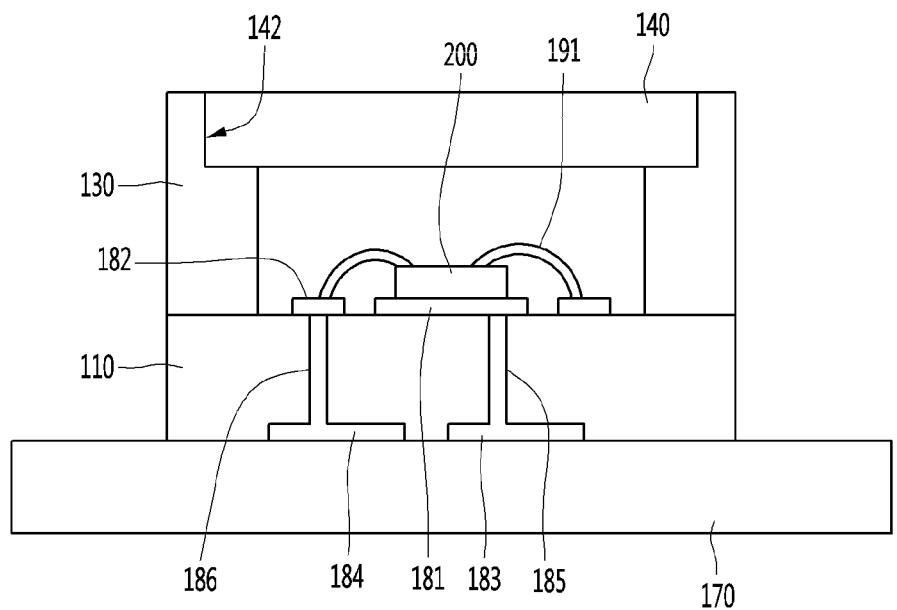
FIG. 1 is a cross-sectional view showing a surface-emitting laser package according to a first embodiment.

FIG. 1 is a cross-sectional view showing a surface-emitting laser package according to a first embodiment.

Referring to FIG. 1, a surface-emitting laser package 100 according to the first embodiment may provide a substrate 110.

The substrate 110 may support all components, for example, a surface-emitting laser device 200 disposed on the substrate 110.

The substrate 110 may include a material having a high thermal conductivity. The substrate 110 may be provided with a material having excellent heat dissipation characteristics so as to efficiently discharge heat generated in the surface-emitting laser device 200 to the outside thereof. The substrate 110 may include an insulating material.

For example, the substrate 110 may include a ceramic material. The substrate 110 may include a low temperature co-fired ceramic (LTCC) or a high temperature co-fired ceramic (HTCC) that is co-fired.

In addition, the substrate 110 may include a metal compound. The substrate 110 may include a metal oxide having a thermal conductivity of 140 W/mK or more. For example, the substrate 110 may include aluminum nitride (AlN) or alumina ($Al_2O_3$).

As another example, the substrate 110 may include a resin-based insulating material. The substrate 110 may be provided with a silicone resin, an epoxy resin, a thermosetting resin including a plastic material, or a high heat-resistant material.

The substrate 110 may include a conductive material. When the substrate 110 is provided with a conductive material, for example, a metal, an insulating layer may be provided for electrical insulation between the substrate 110 and the surface-emitting laser device 200.

The surface-emitting laser package 100 according to the first embodiment may provide the surface-emitting laser device 200.

The surface-emitting laser device 200 may be disposed on the substrate 110. The surface-emitting laser device 200 may generate a laser beam and emit a laser beam in a direction perpendicular to an upper surface of the surface-emitting laser device 200. The surface-emitting laser device 200 may emit a laser beam having a viewing angle of, for example, 15 to 25 degrees upward. The surface-emitting laser device 200 may include a plurality of emitters E1, E2, E3, and E4 that emit a circular beam. An example of the surface-emitting laser device 200 will be described later.

The surface-emitting laser package 100 according to the first embodiment may provide a housing 130. The housing 130 may be disposed on the substrate 110. For example, the substrate 110 may include a first region and a second region surrounding the first region. In this case, the surface-emitting laser device 200 may be disposed on the first region of the substrate 110, and the housing 130 may be disposed on the second region of the substrate 110. The housing 130 may be disposed around the surface-emitting laser device 200.

A height of the housing 130 may be greater than that of the surface-emitting laser device 200. The housing 130 may include a material having a high thermal conductivity. The housing 130 may be provided with a material having excellent heat dissipation characteristics so as to efficiently discharge heat generated in the surface-emitting laser device 200 to the outside thereof. The housing 130 may include an insulating material.

For example, the housing 130 may include a ceramic material. The housing 130 may include a low temperature co-fired ceramic (LTCC) or a high temperature co-fired ceramic (HTCC) that is co-fired.

For example, the housing 130 may include a metal compound. The housing 130 may include a metal oxide having a thermal conductivity of 140 W/mK or more. For example, the housing 130 may include aluminum nitride (AlN) or alumina ($Al_2O_3$).

For example, the housing 130 may include a resin-based insulating material. The housing 130 may be provided with a silicone resin, an epoxy resin, a thermosetting resin including a plastic material, or a high heat-resistant material.

The housing 130 may be made of a conductive material, for example, a metal.

As an example, the housing 130 may include the same material as that of the substrate 110. When the housing 130 is formed of the same material as that of the substrate 110, the housing 130 may be formed integrally with the substrate 110.

In addition, the housing 130 may be formed of a material different from that of the substrate 110. The substrate 110 may be referred to as a housing. In this case, the substrate 110 may be referred to as a first housing, and the housing 130 may be referred to as a second housing. Alternatively, the housing 130 may be referred to as a substrate. In this case, the substrate 110 may be referred to as a first substrate, and the housing 130 may be referred to as a second substrate.

According to the first embodiment, the substrate 110 and the housing 130 may be provided with a material having excellent heat dissipation characteristics. Accordingly, heat generated in the surface-emitting laser device 200 may be effectively discharged to the outside thereof.

According to the first embodiment, when the substrate 110 and the housing 130 are provided and coupled as separate parts, an adhesive layer may be provided between the substrate 110 and the housing 130.

As an example, the adhesive layer may include an organic material. The adhesive layer may include an epoxy-based resin. In addition, the adhesive layer may include a silicone-based resin.

The surface-emitting laser package 100 according to the first embodiment may provide a first electrode 181 and a second electrode 182.

The first electrode 181 and the second electrode 182 may be disposed on the substrate 110. The first electrode 181 and the second electrode 182 may be disposed to be spaced apart from each other on the substrate 110.

One electrode of the first electrode 181 and the second electrode 182 may be disposed around the surface-emitting laser device 200.

The surface-emitting laser device 200 may be disposed on the first electrode 181. In this case, the second electrode 182 may be disposed around the surface-emitting laser device 200.

The surface-emitting laser device 200 may be provided on the first electrode 181 by, for example, a die bonding method. The surface-emitting laser device 200 may be electrically connected to the second electrode 182. As an example, the surface-emitting laser device 200 and the second electrode 182 may be electrically connected by a wire 191. The surface-emitting laser device 200 may be electrically connected to the second electrode 182 by a plurality of wires. The surface-emitting laser device 200 may be electrically connected to the second electrode 182 by the wire 191.

A number of wires connecting the surface-emitting laser device 200 and the second electrode 182 and a connection position thereof may be selected by a size of the surface-emitting laser device 200 or a degree of current diffusion required in the surface-emitting laser device 200.

The surface-emitting laser package 100 according to the first embodiment may provide a first bonding portion 183 and a second bonding portion 184.

The first bonding portion 183 and the second bonding portion 184 may be disposed under the substrate 110. For example, each of the first bonding portion 183 and the second bonding portion 184 may be electrically connected to a signal line (not shown) of a circuit board 170. The substrate 110 may be referred to as the first substrate and the circuit board 170 may be referred to as the second substrate.

The first bonding portion 183 and the second bonding portion 184 may be disposed to be spaced apart from each other under the substrate 110. The first bonding portion 183 and the second bonding portion 184 may have circular pads, but the present embodiment is not limited thereto.

The first bonding portion 183 may be disposed on a lower surface of the substrate 110. The first bonding portion 183 may be electrically connected to the first electrode 181. The first bonding portion 183 may be electrically connected to the first electrode 181 through a first connection wiring 185. The first connection wiring 185 may be disposed, for example, in a first via hole provided in the substrate 110.

The second bonding portion 184 may be disposed on the lower surface of the substrate 110. The second bonding portion 184 may be electrically connected to the second electrode 182. The second bonding portion 184 may be electrically connected to the second electrode 182 through a second connection wiring 186. The second connection wiring 186 may be disposed, for example, in a second via hole provided in the substrate 110.

For example, the first connection wiring 185 and the second connection wiring 186 may include tungsten (W), but the present embodiment is not limited thereto. The tungsten (W) may be melted at a high temperature of 1000° C. or more and then injected into first and second via holes and cured to form the first connection wiring 185 and the second connection wiring 186.

According to the first embodiment, driving power may be supplied to the surface-emitting laser device 200 through the circuit board 170.

The surface-emitting laser package 100 according to the first embodiment described above has been described based on a case in which the surface-emitting laser device 200 is connected to the first electrode 181 by a die bonding method and connected to the second electrode 182 by a wire bonding method.

However, a manner in which the driving power is supplied to the surface-emitting laser device 200 may be variously modified and applied. For example, the surface-emitting laser device 200 may be electrically connected to the first electrode 181 and the second electrode 182 by a flip chip bonding method. In addition, the surface-emitting laser device 200 may be electrically connected to the first electrode 181 and the second electrode 182 by a wire bonding method.

Meanwhile, a step may be provided in an upper region of the housing 130. For example, a recess region 142 may be provided in the upper region of the housing 130. As an example, a width and/or depth of the recess region 142 may be provided by several hundred micrometers. The recess region 142 may be referred to as a stepped portion.

The surface-emitting laser package 100 according to the first embodiment may provide a diffusing part 140.

The diffusing part 140 may be disposed on the surface-emitting laser device 200. The diffusing part 140 may be disposed to be spaced apart from the surface-emitting laser device 200. The diffusing part 140 may be disposed in the recess region 142 of the housing 130. The diffusing part 140 may be supported by the recess region 142 of the housing 130.

An adhesive layer (not shown) may be provided between the diffusing part 140 and the recess region 142 of the housing 130. For example, the adhesive layer may be provided on a lower surface and a side surface of the diffusing part 140 in contact with the inner surface of the recess region 142. For example, the adhesive layer may include an organic material. The adhesive layer may include an epoxy-based resin. In addition, the adhesive layer may include a silicone-based resin.

The diffusing part 140 may extend a viewing angle of a beam of light emitted from the surface-emitting laser device 200.

The diffusing part 140 may include an anti-reflective function. For example, the diffusing part 140 may include an anti-reflective layer disposed on one surface facing the surface-emitting laser device 200. The anti-reflective layer may be formed separately from the diffusing part 140. The diffusing part 140 may include the anti-reflective layer disposed on a lower surface facing the surface-emitting laser device 200. The anti-reflective layer prevents a laser beam incident from the surface-emitting laser device 200 from being reflected from a surface of the diffusing part 140 and transmits the light into the diffusing part 140, thereby improving light loss due to reflection.

The anti-reflective layer may be formed of, for example, an anti-reflective coating film and attached to a surface of the diffusing part 140. The anti-reflective layer may be formed on the surface of the diffusing part 140 through spin coating, spray coating, or the like. As an example, the anti-reflective layer may be formed as a single layer or multiple layers including at least one of the group including $TiO_2$, $SiO_2$, $Al_2O_3$, $Ta_2O_3$, $ZrO_2$, and $MgF_2$.

A shape of the diffusing part 140 will be described in detail later.

The surface-emitting laser package 100 according to the first embodiment may provide a circuit board 170 including at least one signal line. For example, the circuit board 170 includes first to second signal lines, and the first bonding portion 183 and the second bonding portion 184 may be electrically connected to the first signal line and the second signal line.

Meanwhile, as described above, the substrate 110 and the housing 130 may be manufactured by the wafer level package process. According to the embodiment, the diffusing part 140 may also be attached onto the housing 130 by the wafer level package process.

That is, after the surface-emitting laser device 200 and the housing 130 are attached onto the substrate 110 at the wafer level and the diffusing part 140 is attached onto the housing 130, a plurality of semiconductor element packages in which the surface-emitting laser device 200, the housing 130, and the diffusing part 140 are coupled to the substrate 110 by a cutting method such as dicing or the like may be provided.

As described above, when the surface-emitting laser package 100 including the substrate 110, the housing 130, and the diffusing part 140 is manufactured by the wafer level package process, the outer surface of the substrate 110, the outer surface of the housing 130, and the outer surface of the diffusing part 140 are formed in the same plane. That is, there is no step between the outer surface of the substrate 110, the outer surface of the housing 130, and the outer surface of the diffusing part 140.

According to the first embodiment, since there is no step between an outer surface of the substrate 110, an outer surface of the housing 130, and an outer surface of the diffusing part 140, it is possible to fundamentally prevent a defect that causes damage due to moisture permeation, external friction, and the like due to a step structure in the surface-emitting laser package.

According to the first embodiment, the substrate 110 and the housing 130 are manufactured in a wafer level package process, and the diffusing part 140 may be attached onto the housing 130 in a separated process.

According to the first embodiment, the diffusing part 140 may be stably fixed to the housing 130 by an adhesive layer provided between the diffusing part 140 and the recess region 142 of the housing 130.

Figure 2:
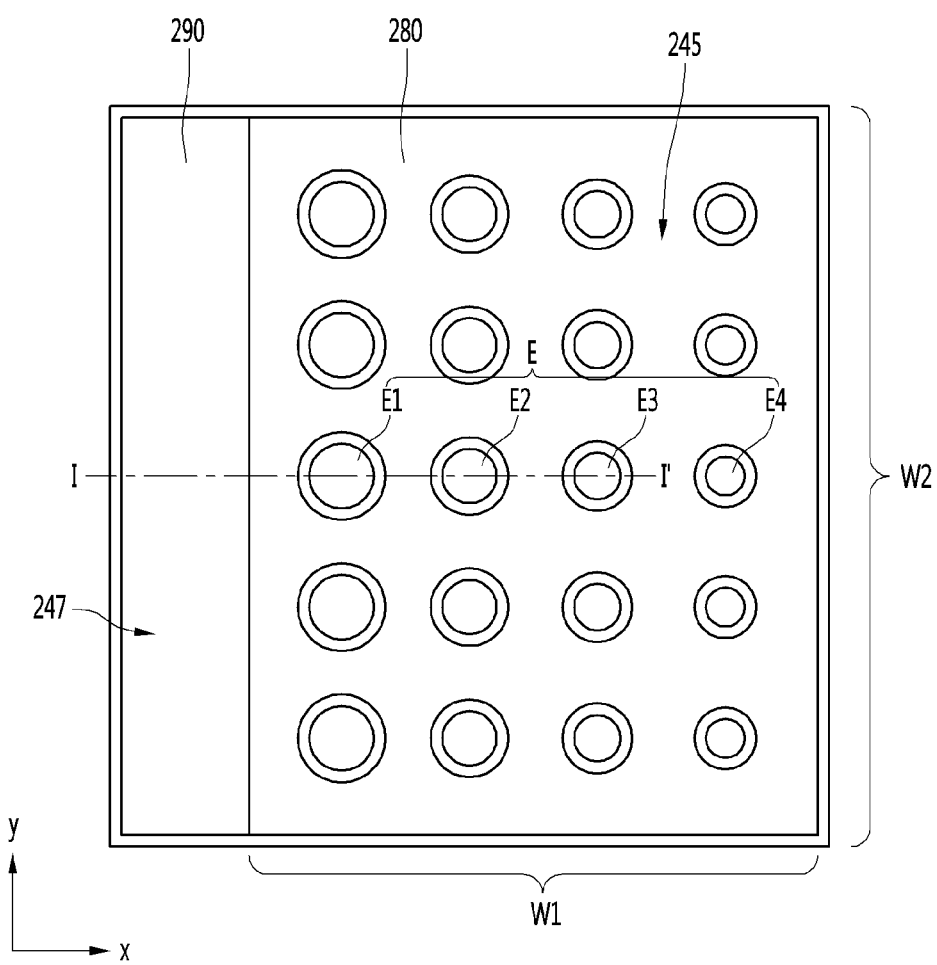
FIG. 2 is a plan view of a surface-emitting laser device according to the first embodiment.

Hereinafter, a surface-emitting laser device 200 will be described in detail. FIG. 2 is a plan view of the surface-emitting laser device according to the first embodiment, and FIG. 3 is a cross-sectional view taken along line I-I' of the surface-emitting laser device according to the first embodiment shown in FIG. 2.

Referring to FIG. 2, the surface-emitting laser device 200 according to the first embodiment may include a light emitting region 245 and a non-light emitting region 247. The non-light emitting region 247 is a region in which laser beam is not emitted, and for example, a pad electrode 290 may be disposed therein. The light emitting region 245 is a region in which the laser beam is emitted, and for example, a light emitting structure E may be disposed.

The light emitting structure E may include a plurality of emitters E1, E2, E3, and E4. Each of the emitters E1, E2, E3, and E4 may be spaced apart from each other. The light emitting structure E may include a second electrode 280. The light emitting region 245 may include a first region and a second region. The first region may be defined in plural, and a region between the first regions may be defined as the second region. In this case, each of the emitters E1, E2, E3, and E4 may be disposed in the first region, and the second electrode 280 may be disposed in the second region. Each of the emitters E1, E2, E3, and E4 may be surrounded by the second electrode 280. The second electrode 280 may be formed integrally with the pad electrode 290, but is not limited thereto. The second electrode 280 may extend from the pad electrode 290 to the light emitting region 245 and be disposed in the light emitting region 245. As will be described later, the second electrode 280 may electrically connect the plurality of emitters E1, E2, E3, and E4 to the pad electrode 290.

Figure 3:
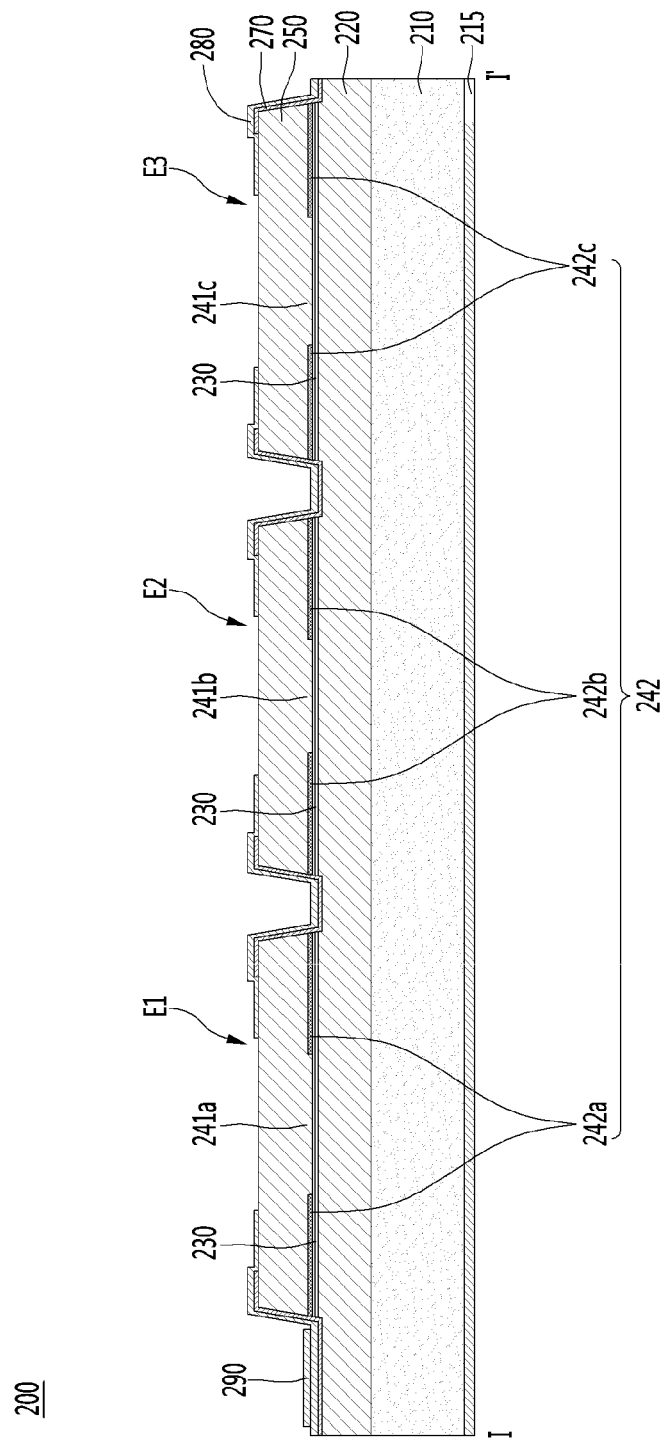
FIG. 3 is a cross-sectional view taken along line I-I' of the surface-emitting laser device according to the embodiment shown in FIG. 2.

Referring to FIG. 3, the surface-emitting laser device 200 according to the first embodiment may include any one or more of a first electrode 215, a substrate 210, a first reflective layer 220, a light emitting layer 230, an aperture 241, an oxidation layer 242, a second reflective layer 250, a second electrode 280, a passivation layer 270, and a pad electrode 290.

The light emitting layer 230 may include an active layer (not shown) and a cavity (not shown), which will be described below. The oxidation layer 242 may include a first insulating region 242a disposed in the first emitter E1, a second insulating region 242b disposed in the second emitter E2, and a third insulating region 242c disposed in the third emitter E3, but is not limited thereto.

<Substrate, First Electrode>

In an embodiment, the substrate 210 may be a conductive substrate or a non-conductive substrate. When the conductive substrate is used, a metal having excellent electrical conductivity may be used, and since heat generated at the time of operating the surface-emitting laser device 200 should be sufficiently dissipated, a GaAs substrate or a metal substrate having high thermal conductivity, or a silicon (Si) substrate, or the like may be used.

When the non-conductive substrate is used, an AlN substrate or a sapphire ($Al_2O_3$) substrate, or a ceramic-based substrate may be used.

In an embodiment, the first electrode 215 may be disposed under the substrate 210, and the first electrode 215 may be disposed in a single layer or a plurality of layers as a conductive material. For example, the first electrode 215 may be a metal, and may include at least one of aluminum (Al), titanium (Ti), chrome (Cr), nickel (Ni), copper (Cu), and gold (Au) and be formed as a single layer or a multi-layer structure, thereby improving an electrical characteristic and a light output.

<First Reflective Layer>

The first reflective layer 220 may be disposed on the substrate 210.

The first reflective layer 220 may be doped with a first conductivity type. For example, the first conductive dopant may include an n-type dopant such as Si, Ge, Sn, Se, and Te.

In addition, the first reflective layer 220 may include a gallium-based compound, for example, AlGaAs, but is not limited thereto. The first reflective layer 220 may be a distributed Bragg reflector (DBR). For example, the first reflective layer 220 may have a structure in which a first layer and a second layer made of materials having different refractive indexes are alternately stacked at least once.

The first layer and the second layer may include AlGaAs, and more specifically, may be made of a semiconductor material having a composition formula of $Al_xGa_{(1-x)}As$ ($0<x<1$). Here, when Al in the first layer or the second layer increases, a refractive index of each layer may decrease, and when Ga increases, the refractive index of each layer may increase.

In addition, a thickness of each of the first layer and the second layer may be $\lambda/4n$, $\lambda$ may be a wavelength of light generated in the light emitting layer 230, and n may be the refractive index of each layer with respect to light of the above-described wavelength. Here, $\lambda$ may be from 650 to 980 nanometers (nm), and n may be the refractive index of each layer. The first reflective layer 220 having such a structure may have a reflectance of 99.999% with respect to light in a wavelength region of about 940 nm.

The thickness of the first layer and the second may be determined according to each refractive index and a wavelength $\lambda$ of light emitted in the light emitting layer 230.

<Cavity Region, Insulation Region, Aperture>

In an embodiment, the light emitting layer 230, the oxidation layer 242, and the aperture 241 may be disposed on the first reflective layer 220. In detail, the light emitting layer 230 may be disposed on the first reflective layer 220, the oxidation layer 242 and the aperture 241 may be disposed on the light emitting layer 230.

The light emitting layer 230 may include an active layer (not shown), a first cavity (not shown) disposed under the active layer, and a second cavity (not shown) disposed thereon. The light emitting layer 230 of an embodiment may include both the first cavity and the second cavity, or may include only one of the two.

The light emitting layer 230 may be disposed between the first reflective layer 220 and the second reflective layer 250. An active layer may be disposed on the light emitting layer 230 of an embodiment. The active layer may include any one of a double hetero structure, a multiple well structure, a single quantum well structure, a multi quantum well (MQW) structure, a quantum dot structure, and a quantum-wire structure.

The active layer 232 may be formed of a well layer and a barrier layer using a compound semiconductor material of a Group III-V element, for example, a pair structure such as AlGaInP/GaInP, AlGaAs/AlGaAs, AlGaAs/GaAs, and GaAs/InGaAs, but is not limited thereto. The well layer may be formed of a material having an energy band gap smaller than that of the barrier layer.

The first cavity 231 and the second cavity 233 may be formed of $Al_yGa_{(1-y)}As$ ($0<y<1$), but are not limited thereto.

In an embodiment, the oxidation layer 242 and the aperture 241 may be disposed on the light emitting layer 230.

For example, the first emitter E1 may include the first insulating region 242a and a first aperture 241a, and the second emitter E2 may include the second insulating region 242b and a second aperture 241b. In addition, the third emitter E3 may include the third insulating region 242c and a third aperture 241c, and the fourth emitter E4 may include a fourth insulating region (not shown) and a fourth aperture (not shown).

The oxidation layer 242 is an insulating layer made of an insulating material, for example, aluminum oxide, and may serve as a current blocking layer. Each of the apertures 241a, 241b, and 241c positioned in a central region of each insulating region may be a non-insulating layer, that is, a conductive layer.

The oxidation layer 242 may surround the aperture 241. A size of the aperture 241 may be adjusted by the oxidation layer 242. For example, as an area of the oxidation layer 242 occupied on the light emitting layer 230 increases, an area of the aperture 241 may decrease.

For example, the first aperture 241a may be defined by the first insulating region 242a, and for example, the second aperture 241b may be defined by the second insulating region 242b. In addition, the third aperture 241c may be defined by the third insulating region 242c, and the fourth aperture may be defined by the fourth insulating region. Specifically, each oxidation layer 242 may include aluminum gallium arsenide. For example, the oxidation layer 242 may be formed as AlGaAs reacts with $H_2O$ and the edge thereof changes to aluminum oxide ($Al_2O_3$), and each aperture made of AlGaAs may be formed in a central region thereof not reacting with $H_2O$.

According to an embodiment, a laser beam emitted from the light emitting layer 230 through each of the apertures 241a, 241b, and 241c may be emitted toward an upper region, and compared with the insulating regions 242a, 242b, and 242c, light transmittance of the aperture 241 may be excellent.

<Second Reflective Layer>

The second reflective layer 250 may be disposed on the light emitting layer 230.

The second reflective layer 250 may include a gallium-based compound such as AlGaAs, and the second reflective layer 250 may be doped with a second conductive dopant. For example, the second conductive dopant may be a p-type dopant such as Mg, Zn, Ca, Sr, and Ba. Meanwhile, the first reflective layer 220 may be doped with the p-type dopant, and the second reflective layer 250 may be doped with an n-type dopant.

The second reflective layer 250 may be a distributed Bragg reflector (DBR). For example, the second reflective layer 250 may be a structure in which a first layer (not shown) and a second layer (not shown) made of materials having different refractive indexes are alternately stacked at least once.

The first layer and the second layer may include AlGaAs and in detail, may be made of a semiconductor material having a composition formula of $Al_xGa_{(1-x)}As$ (0<x<1). Here, when Al increases, the refractive index of each layer may decrease, and when Ga increases, the refractive index of each layer may increase. In addition, a thickness of each of the first layer and the second layer may be $\lambda/4n$, $\lambda$ may be a wavelength of light emitted from the active layer, and n may be the refractive index of each layer with respect to the light of the above-described wavelength.

The second reflective layer 250 having such a structure may have a reflectivity of 99.9% with respect to light having a wavelength region of 940 nm.

The second reflective layer 250 may be formed by alternately stacking a third layer and a fourth layer, and the number of pairs of the first layer and the second layer in the first reflective layer 220 may be greater than that of pairs of the third layer and the fourth layer in the second reflective layer 250. At this point, as described above, the reflectance of the first reflective layer 220 is about 99.999%, which may be greater than that of the second reflective layer 250, 99.9%. For example, the number of pairs of the first layer and the second layer in the first reflective layer 220 may be 20 to 50 times, and the number of pairs of the third layer and the fourth layer in the second reflective layer 250 may be 10 times to 30 times.

<Passivation Layer, Second Electrode>

A passivation layer 270 may be disposed on a side surface and an upper surface of the emitters E1, E2, E3, and E4 and an upper surface of the first reflective layer 220 exposed between the emitters E1, E2, E3, and E4. The passivation layer 270 may be disposed on a side surface of each emitter E1, E2, E3, and E4 separated into units of segments to protect and insulate each emitter E1, E2, E3, and E4. The passivation layer 270 may be made of an insulating material, for example, a nitride or an oxide.

The second electrode 280 may be disposed to be electrically connected to the second reflective layer 250. That is, the second electrode 280 may be in contact with a portion of the second reflective layer 250 via the passivation layer 270 extending from the pad electrode 290 and surrounding each emitter E1, E2, E3, and E4. The second electrode 280 may be disposed on the passivation layer 270.

The second electrode 280 may be made of a conductive material, for example, a metal. For example, the second electrode 280 may be formed of a single layer or a multilayer structure including at least one of aluminum (Al), titanium (Ti), chromium (Cr), nickel (Ni), copper (Cu), and gold (Au).

In the first embodiment, the light output may be improved by modifying the shape of the diffusing part 140. Specifically, when the light emitting region 245 of the surface-emitting laser device 200 has a rectangular shape, the light output may be improved by modifying the shape of the diffusing part 140 to be optimized for the light emitting region 245 of the surface-emitting laser device 200, and by disposing the modified diffusing part 140 on the surface-emitting laser device 200.

As shown in FIG. 2, the surface-emitting laser device 200 may include a light emitting region 245 from which a laser beam is emitted and a non-light emitting region 247 that does not emit a laser beam and is in contact with the light emitting region 245.

The non-light emitting region 247 is a region in which the pad electrode 290 as a bonding pad for electrical connection to the outside is disposed, and no laser beam is generated in the non-light emitting region 247. The light emitting region 245 may include a light emitting structure E, and the light emitting structure E may include a plurality of emitters E1, E2, E3, and E4. A laser beam is generated in each of the plurality of emitters E1, E2, E3, E4, and the generated laser beam may be emitted, for example, toward an upper direction thereof. Therefore, the light emitting region 245 may be a region in which laser beams generated by the plurality of emitters E1, E2, E3, and E4 are emitted.

While the surface-emitting laser device 200 including the light emitting region 245 and the non-light emitting region 247 has a square shape, the light emitting region 245 of the surface-emitting laser device 200 may have a rectangular shape, but the embodiment is not limited thereto. The light emitting region 245 may have a first width W1 in the x-axis direction (hereinafter referred to as a first direction) and a second width W2 in the y-axis direction (hereinafter referred to as a second direction). The second width W2 may be larger than the first width W1. Therefore, the light emitting region 245 may have a rectangular shape longer in the second direction than in the first direction.

The shape of the diffusing part 140 is modified so that the light output may be improved by being optimized for the surface-emitting laser device 200 having such a shape, and thus the light output emitted from the diffusing part 140 may be improved.

Figure 4:
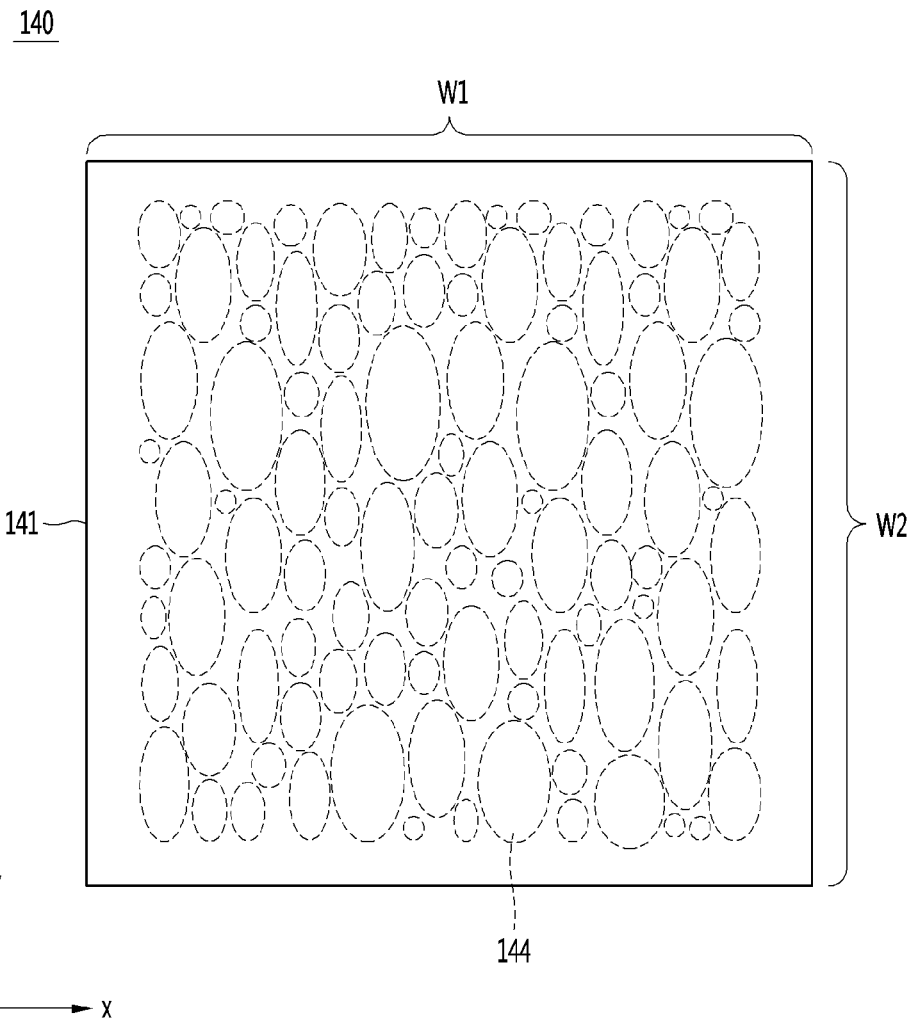
FIG. 4 is a plan view showing a diffusing part according to the first embodiment.

As shown in FIGS. 2 and 4, the diffusing part 140 may be disposed on the surface-emitting laser device 200.

The diffusing part 140 may include a plate 141 and a pattern array 144. The pattern array 144 may be disposed under the plate 141, but is not limited thereto. The pattern array 144 may be referred to as a pattern layer.

The plate 141 may be made of a material having excellent durability and strength, for example, glass. The pattern array 144 may be made of a material that may be easily processed, for example, a polymer resin.

As another example, the pattern array 144 and the plate 141 may be made of the same material, glass, or a polymer resin. For example, a surface of a base substrate of the polymer resin may be surface-treated to form a pattern array 144 on the surface of the base substrate.

The pattern array 144 may be disposed on a lower surface of the plate 141 of the diffusing part 140 so as to face the surface-emitting laser device 200.

The pattern array 144 may include a plurality of patterns 145. For example, the pattern 145 may include a micro-lens, a concavo-convex pattern, or the like. A size of the pattern 145 may be uniform, but the embodiment is not limited thereto.

The plurality of patterns 145 may be arranged in a line along the first direction. The plurality of patterns 145 may be arranged in a line along the second direction.

In the pattern 145, a width (or length) in the first direction and a width in the second direction may be different. Each pattern 145 may have a short axis along the first direction and a long axis along the second direction. Therefore, a length of the long axis of the pattern 145 may be larger than that of the short axis of the pattern 145.

The size of each pattern 145 may have different random shapes. For example, some patterns may have an elliptical shape that is nearly a circular shape. Some patterns may have an elliptical shape that is nearly like a bar shape. As described above, even though the sizes of the patterns 145 are different from each other, each pattern 145 may have the long axis along the second direction.

A thickness (or height) of each pattern 145 may be different from each other. The thickness of some patterns may be larger or smaller than the thickness of other patterns. The pattern 145 may have a protruding region protruding from the plate 141, for example, along a lower direction. The lowest point of the protruding region may be different from each other for each pattern. The lowest point of the protruding region may have a vertex, but the embodiment is not limited thereto. The surface of each pattern may have a round shape, a straight shape, or the like. Each pattern may have a bumpy shape. Some patterns may be disposed to be in contact with each other and other patterns may be disposed to be spaced apart from each other.

Figure 5:
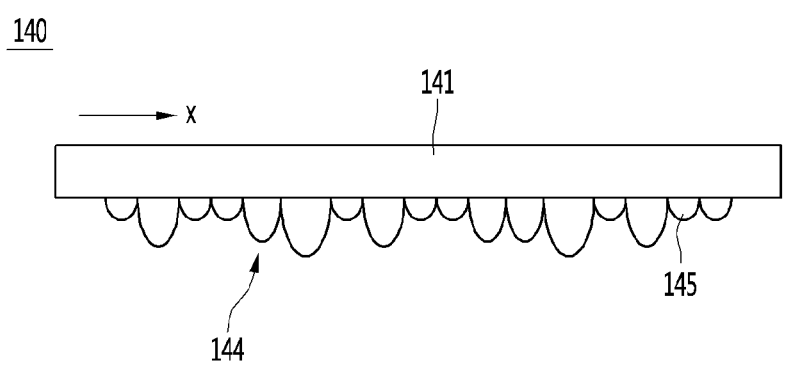
FIG. 5 is a cross-sectional view showing along an x-axis direction of the diffusing part according to the first embodiment.
Figure 6:
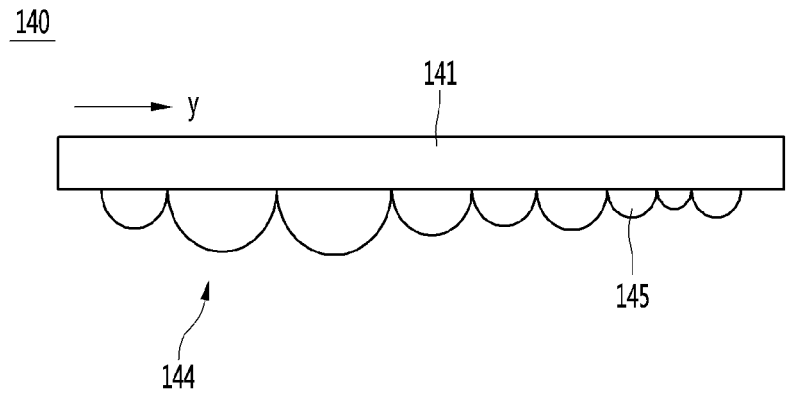
FIG. 6 is a cross-sectional view showing along a y-axis direction of the diffusing part according to the first embodiment.

As shown in FIG. 5 and FIG. 6, six patterns are disposed in a line along the first direction, and 13 patterns are disposed in a line along the second direction, so that a total of 78 patterns 145 may be disposed at a lower portion of the plate 141 of the diffusing part 140.

Figure 7:
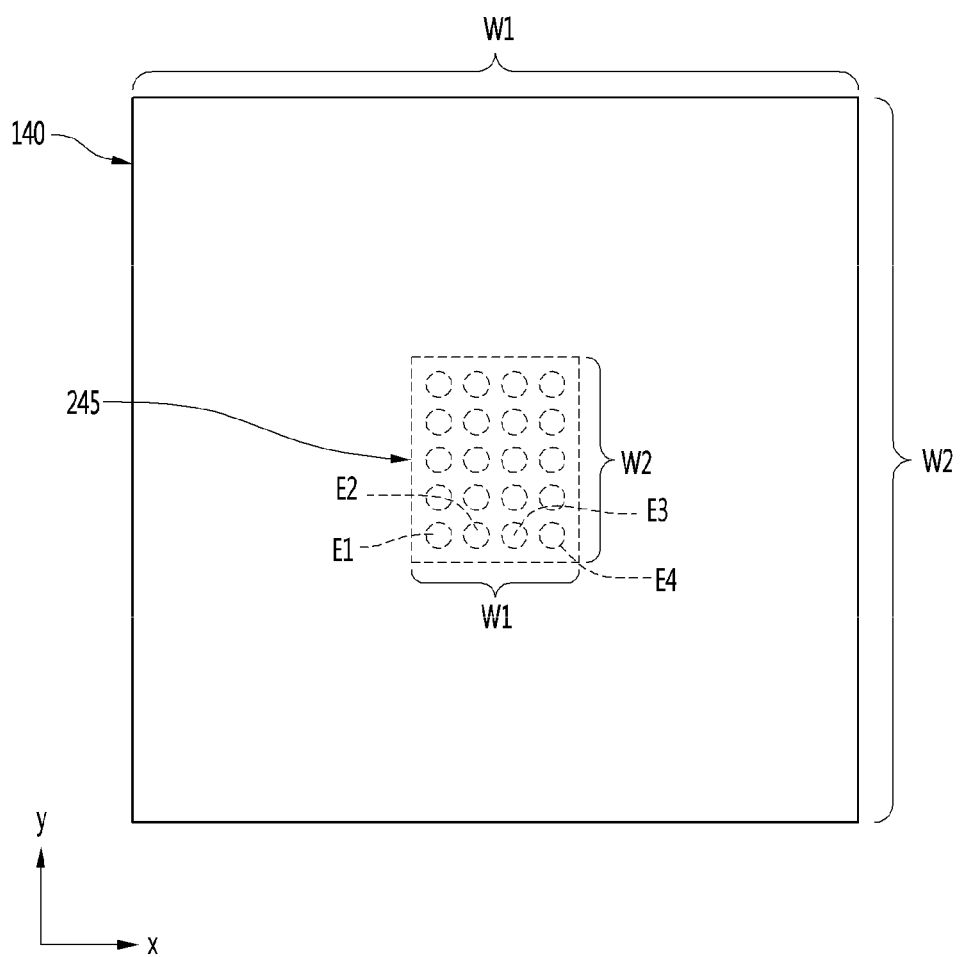
FIG. 7 is a plan view showing the surface-emitting laser device and the diffusing part according to the first embodiment.

As shown in FIG. 7, the diffusing part 140 may have, for example, a first width W1 in a first direction and a second width W2 in a second direction. In this case, the first width W1 and the second width W2 may be the same. Therefore, the diffusing part 140 may have a square shape, but the embodiment is not limited thereto.

Each of the first width W1 and the second width W2 of the diffusing part 140 may be at least greater than the first width W1 or the second width W2 of the light emitting region 245 of the surface-emitting laser device 200.

Figure 8:
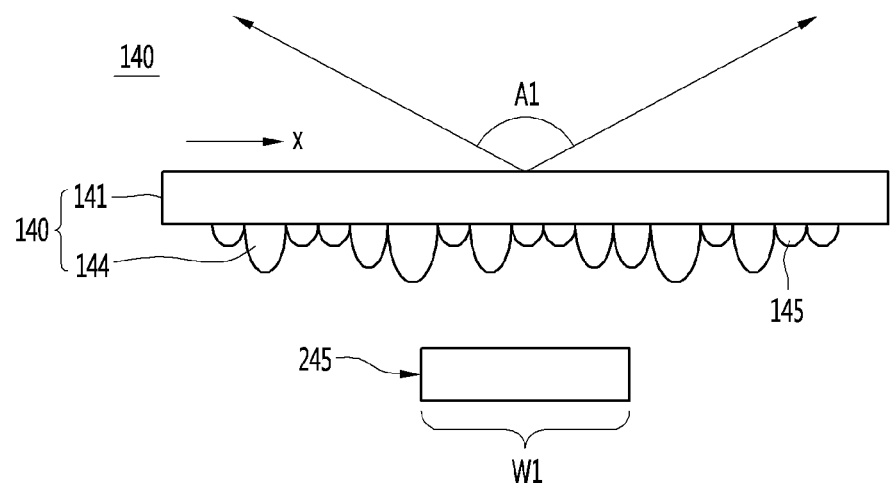
FIG. 8 is a cross-sectional view showing the surface-emitting laser device and the diffusing part along the x-axis direction according to the first embodiment.

FIG. 8 is a cross-sectional view showing a surface-emitting laser device and a diffusing part according to an embodiment along an x-axis direction.

As shown in FIG. 8, a first laser beam emitted from a light emitting region 245 of a surface-emitting laser device 200 having a first width W1 may be emitted as a second laser beam having a first viewing angle A1 by a diffusing part 140. Since a pattern array 144 of the diffusing part 140 has a short axis in a first direction, the first laser beam may be more refracted by the pattern array 144 of the diffusing part 140. As described above, the refracted first laser beam is incident on an upper surface of a plate 141 of the diffusing part 140 at a larger incident angle, and may be emitted as the second laser beam having a larger emission angle from an upper surface of the diffusing part 140.

For example, when the plate 141 of the diffusing part 140 is made of a glass material having a refractive index of 1.51 to 1.54, a critical angle may be about 41.8° at the upper surface of the plate 141 in which the plate 141 of the diffusing part 140 is in contact with air.

When an incident angle larger than 41.8° is incident on the upper surface of the plate 141 of the diffusing part 140, the first laser beam is totally reflected and is not transmitted. Therefore, the first laser beam is incident on the upper surface of the plate 141 of the diffusing part 140 at a larger incident angle, but a pattern 145 of the pattern array 144 of the diffusing part 140 may be designed such that the incident angle is smaller than 41.8°.

The laser beam generated by the surface-emitting laser device 200 may be referred to as a first laser beam, and the laser beam emitted from the diffusing part 140 may be referred to as a second laser beam.

Figure 10A:
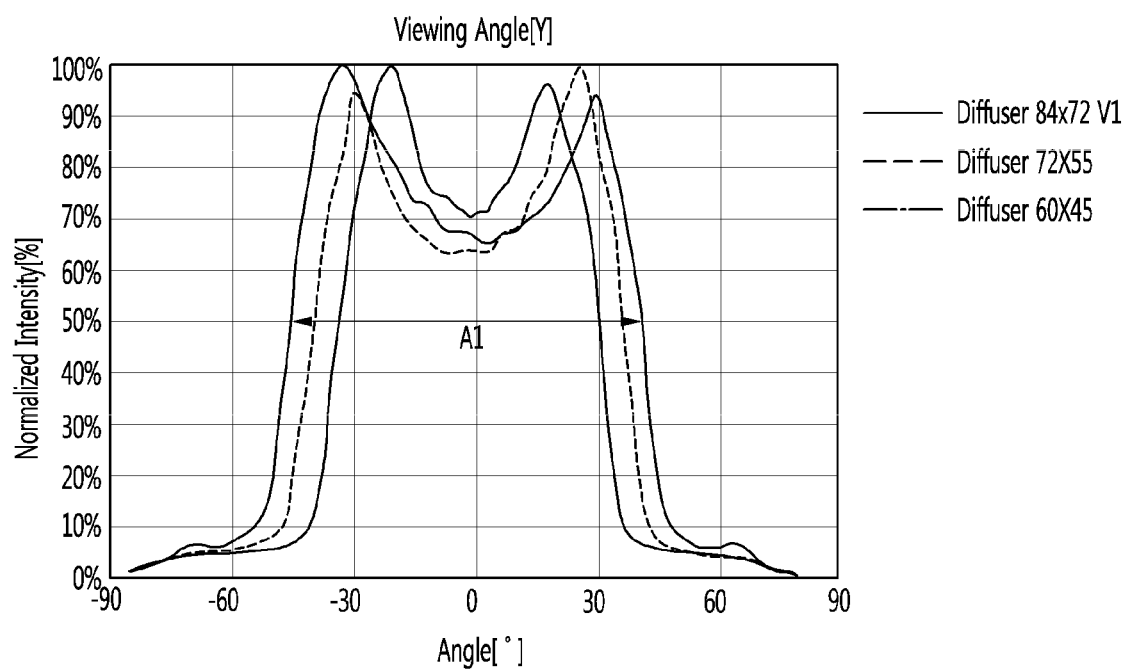
FIG. 10A shows a first viewing angle along an x-axis direction in output light of a diffusing part.

FIG. 10A shows a first viewing angle along an x-axis direction in output light of a diffusing part.

Intensity of the second laser beam measured while moving from −90° to +90° with respect to the center of the diffusing part 140 may be shown as in FIG. 10A. An angle range corresponding to 50% of the intensity of the second laser beam measured as described above may be defined as the viewing angle.

The first viewing angle A1 of the second laser beam may be 70° to 85°, but the embodiment is not limited thereto. When a first viewing angle A1 of 85° or more is obtained, the first laser beam having an incident angle close to the critical angle may be incident on the upper surface of the plate 141 of the diffusing part 140 to be totally reflected. When a first viewing angle A1 of 70° or less is obtained, it is the same as a second viewing angle A2 described later, and thus the light output may not be improved.

In the diffusing part 140 corresponding to a first axis (x-axis) of the surface-emitting laser device 200, a second laser beam having a relatively large first viewing angle A1 may be emitted.

Figure 9:
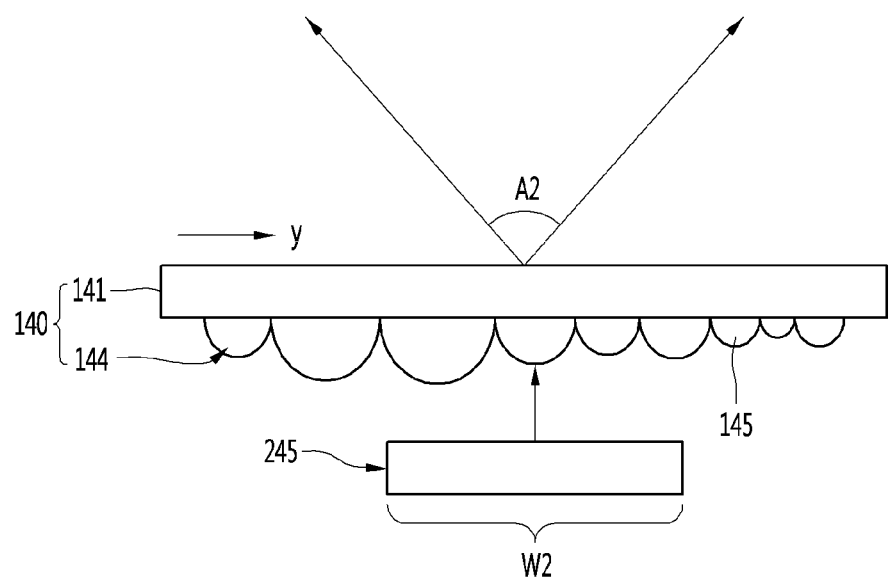
FIG. 9 is a cross-sectional view showing the surface-emitting laser device and the diffusing part along the y-axis direction according to the first embodiment.

FIG. 9 is a cross-sectional view of a surface-emitting laser device 200 and a diffusing part in a y-axis direction according to an embodiment.

As shown in FIG. 9, a first laser beam emitted from a light emitting region 245 of the surface-emitting laser device 200 having a second width W2 larger than a first width W1 may be emitted as a second laser beam having a second viewing angle A2 by a diffusing part 140. Since a pattern array 144 of a diffusing part 140 has a long axis in a second direction, the first laser beam may be less refracted by the pattern array 144 of the diffusing part 140. As described above, the first laser beam that is less refracted is incident on an upper surface of a plate 141 of the diffusing part 140 at a smaller incident angle, and may be emitted as the second laser beam having a smaller emission angle from an upper surface of the diffusing part 140. In this case, an emission angle of the second laser beam emitted from a short axis of a pattern 145 of the pattern array 144 of the diffusing part 140 may be larger than an emission angle of the second laser beam emitted from a long axis of the pattern 145 of the pattern array 144 of the diffusing part 140.

Figure 10B:
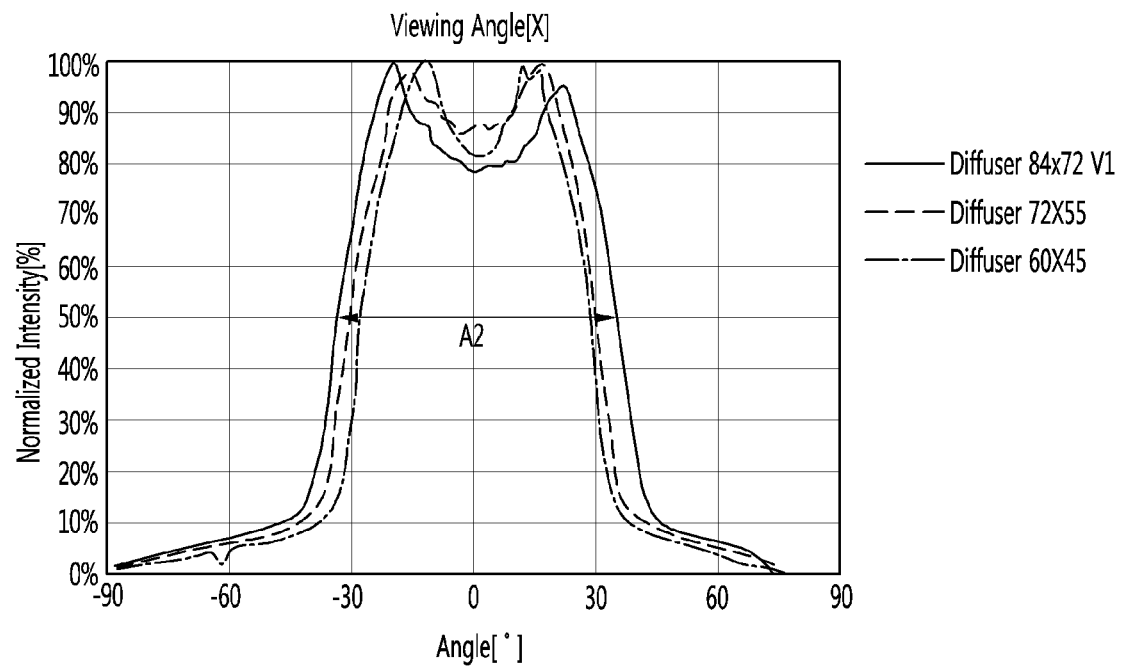
FIG. 10B shows a second viewing angle along a y-axis direction in the output light of the diffusing part.

As shown in FIG. 10B, the second viewing angle A2 of the second laser beam may be 50° to 70°, but the embodiment is not limited thereto. When a second viewing angle A2 of 70° or more is obtained, it is the same as the first viewing angle A1, and thus the light output may not be improved. When a second viewing angle A2 of 50° or less is obtained, a viewing angle is narrow, and thus it may not serve a diffusion function. In the diffusing part 140 corresponding to a second axis (y-axis) of the surface-emitting laser device 200, a second laser beam having a relatively small second viewing angle A2 may be emitted.

As described above, the first laser beam emitted from the surface-emitting laser device 200 may be emitted as the second laser beam having the first viewing angle A1 in the first direction and the second viewing angle A2 in the second direction by the diffusing part 140. The first viewing angle A1 may be 10° to 20° larger than the second viewing angle A2, but the embodiment is not limited thereto. When the first viewing angle A1 is 20° or more larger than the second viewing angle A2, the light output of the second laser beam output from the diffusing part 140 may be reduced by total reflection at the diffusing part 140. When the first viewing angle A1 has a difference of 10° or less from the second angle of view A2, the light output may be reduced.

The second laser beam may have a rectangular shape. That is, the second laser beam may have a rectangular shape in which the first viewing angle A1 in the first direction is larger than the second viewing angle A2 in the second direction.

Hereinafter, experimental results of the surface-emitting laser package according to the first embodiment will be described.

In the first embodiment, two samples #1 and #2 were used.

In both a first sample #1 and a second sample #2, 14 emitters may be arranged along the first direction and 22 emitters may be arranged along the second direction in the light emitting region 245 of the surface-emitting laser device 200. On the other hand, in the first sample, the pattern array 144 arranged to have a larger viewing angle in the diffusing part 140 may be disposed to coincide with the first direction, and in the second sample, the pattern array 144 arranged to have a larger viewing angle in the diffusing part 140 may be disposed to coincide with the second direction.

As the diffusing part 140, a diffusing part 140 having viewing angles of 84° and 72° and a diffusing part 140 having viewing angles of 72° and 55° were used.

Figure 11:
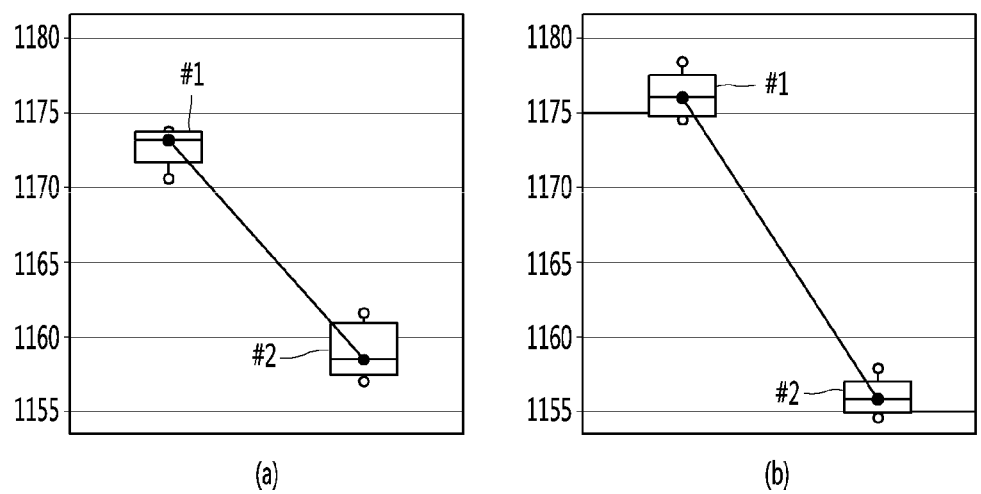
FIGS. 11A and 11B show light output of a surface-emitting laser package according to an embodiment.

FIGS. 11A and 11B show light output of a surface-emitting laser package according to an embodiment.

As shown in FIG. 11A, when the diffusing part 140 having viewing angles of 84° and 72° was used, light output in the first sample #1 was obtained at approximately 1.18% larger than that in the second sample #2. From this, it may be confirmed that a larger light output may be obtained when a short axis of a pattern array 144 of the diffusing part 140 from which a wide viewing angle of 84° is obtained is disposed so as to coincide with a short axis of a light emitting region 245 of a surface-emitting laser device 200 (first sample #1) than when a long axis of the pattern array 144 of the diffusing part 140 from which a narrow viewing angle of 72° is obtained is disposed so as to coincide with the short axis of the light emitting region 245 of the surface-emitting laser device 200 (second sample #2).

As shown in FIG. 11B, when the diffusing part 140 has viewing angles of 72° and 55°, the light output in the first sample #1 was obtained at approximately 1.76% larger than that in the second sample #2. From this, it may be confirmed that a larger light output may be obtained when a short axis of a pattern array 144 of the diffusing part 140 from which a wide viewing angle of 72° is obtained is disposed so as to coincide with the short axis of the light emitting region 245 of the surface-emitting laser device 200 (first sample #1) than when a long axis of the pattern array 144 of the diffusing part 140 from which a narrow viewing angle of 55° is obtained is disposed so as to coincide with the short axis of the light emitting region 245 of the surface-emitting laser device 200 (second sample #2).

It may be confirmed that a larger light output is obtained when the diffusing part 140 having a smaller viewing angle range is used (FIG. 11B) than when it is not (FIG. 11A).

From FIGS. 11A and 11B, a larger light output may be obtained by disposing such that the short axis of the pattern array 144 of the diffusing part 140 from which the wide viewing angle is obtained coincides with the short axis of the light emitting region 245 of the surface-emitting laser device 200, or by reducing the range of the viewing angle, a larger light output can be obtained.

Figure 12:
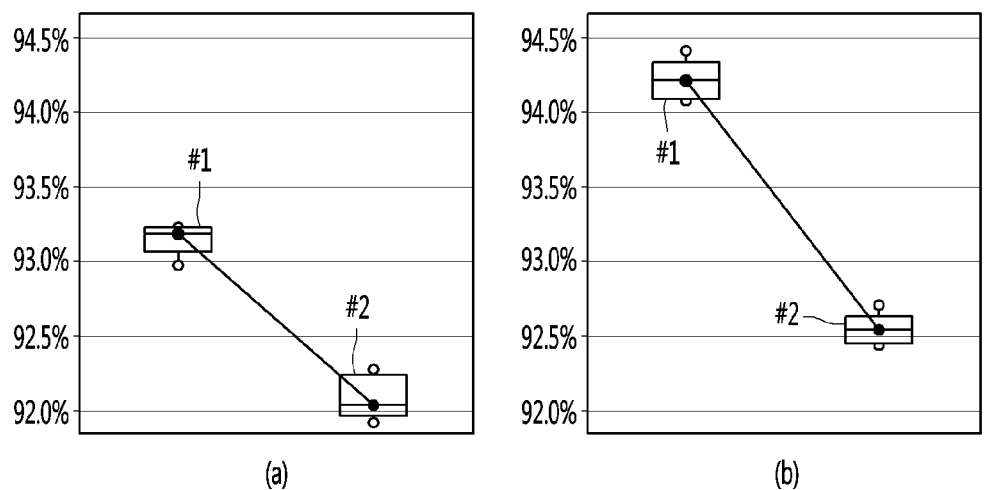
FIGS. 12A and 12B show power droop of a surface-emitting laser package according to an embodiment.

FIGS. 12A and 12B show a power droop of a surface-emitting laser package according to an embodiment.

The power droop may be defined as a rate of decrease of the light output measured from the diffusing part 140 after the diffusing part 140 is disposed on the surface-emitting laser package with respect to the light output measured from the surface-emitting laser package in a state in which the diffusing part 140 is absent. Therefore, as the power droop increases, the light output emitted by the diffusing part 140 may also increase.

As shown in FIG. 12A, when the diffusing part 140 having viewing angles of 84° and 72° is used, the power droop in the first sample #1 may be obtained at approximately 93.2%, whereas the power droop in the second sample #2 may be obtained at approximately 92% smaller than this. From this, since the power droop in the first sample #1 is obtained larger than that in the second sample #2, it may be confirmed that the light output in the first sample #1 is obtained larger than that in the second sample #2.

As shown in FIG. 12B, when the diffusing part 140 having viewing angles of 72° and 55° is used, the power droop in the first sample #1 may be obtained at approximately 94.2%, whereas the power droop in the second sample #2 may be obtained at approximately 92.5% smaller than this. From this, since the power droop in the first sample #1 is obtained larger than that in the second sample #2, it may be confirmed that the light output in the first sample #1 is obtained larger than that in the second sample #2.

Second Embodiment

Figure 13:
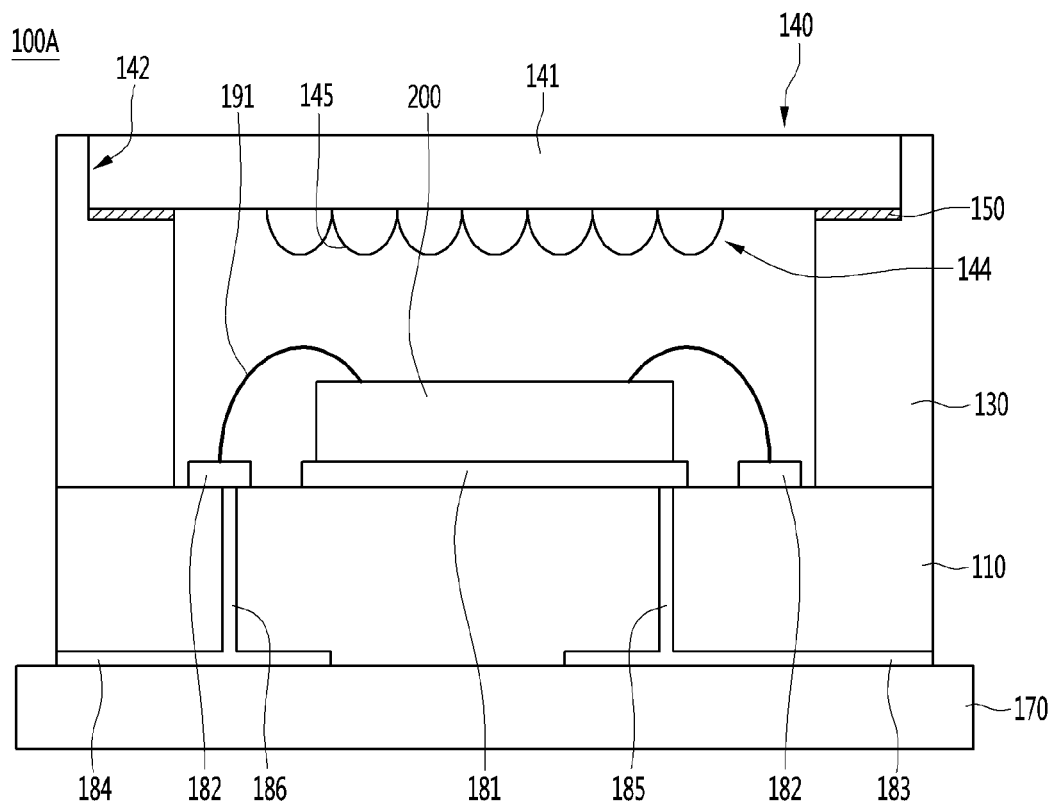
FIGS. 13 and 14 are cross-sectional views showing a surface-emitting laser package according to a second embodiment.
Figure 14:
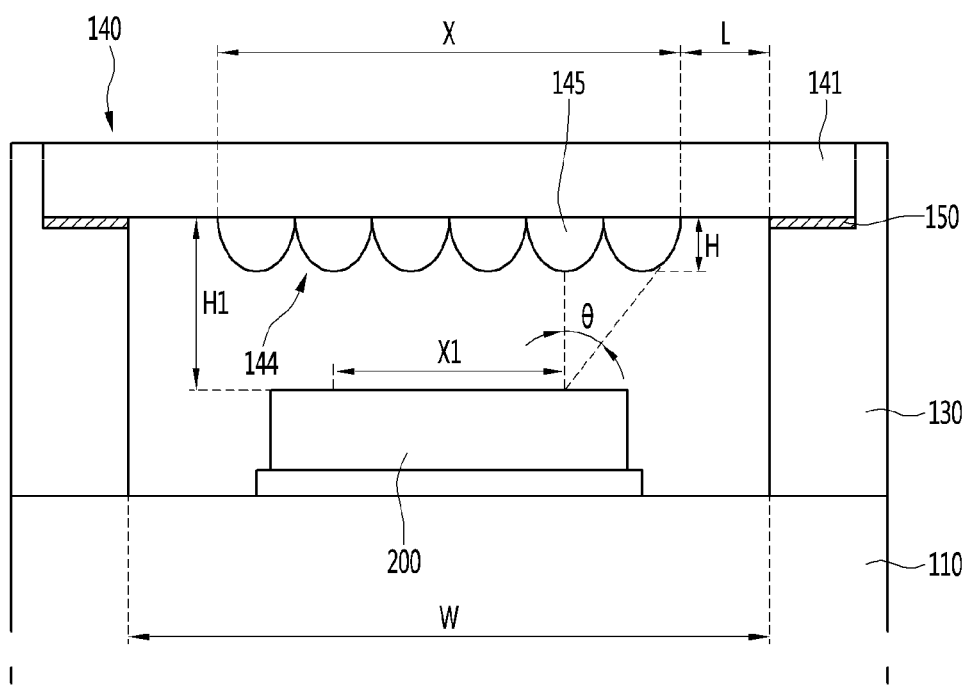
Figure 15:
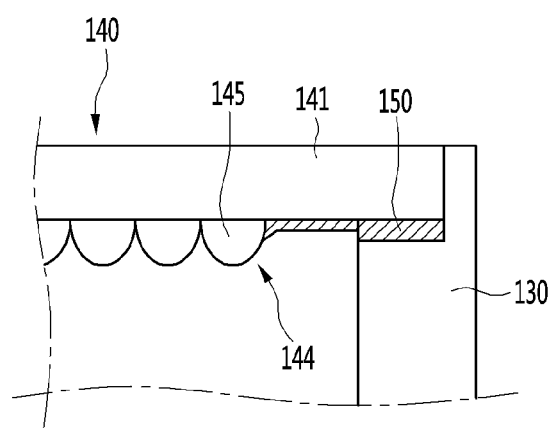
FIG. 15 is a schematic sectional view showing a flow of an adhesive member of the surface-emitting laser package according to the second embodiment.
Figure 16:
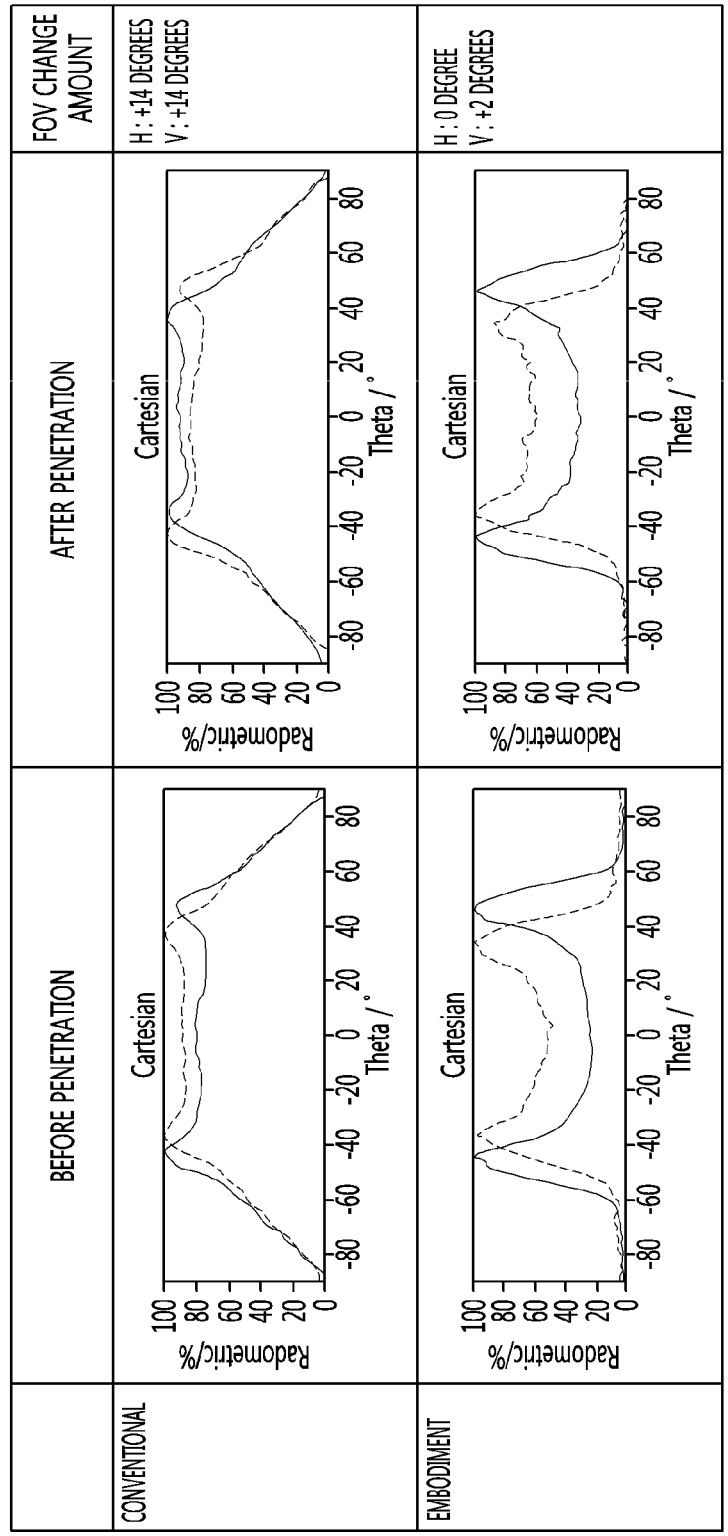
FIG. 16 is a view showing beam directivity characteristics of the surface-emitting laser package according to the second embodiment.

FIGS. 13 and 14 are cross-sectional views showing a surface-emitting laser package according to a second embodiment, FIG. 15 is a schematic sectional view showing a flow of an adhesive member of the surface-emitting laser package according to the second embodiment, and. FIG. 16 is a view showing beam directivity characteristics of the surface-emitting laser package according to the second embodiment.

The second embodiment is the same as the first embodiment except that the structure of the diffusing part 140 has changed. In the second embodiment, components having the same functions, structures, or shapes as those of the first embodiment will be designated by the same reference numerals, and detailed descriptions thereof will be omitted. The description omitted in the second embodiment may be easily understood from the first embodiment described above.

Referring to FIG. 13, a surface-emitting laser package 100A according to the second embodiment may include a substrate 110, a housing 130, a surface-emitting laser device 200, and a diffusing part 140.

According to an embodiment, when the substrate 110 and the housing 130 are provided and coupled as separate components, an adhesive member 150 may be provided between the substrate 110 and the housing 130.

For example, the adhesive member 150 may include an organic material. The adhesive member 150 may include an epoxy-based resin. In addition, the adhesive member 150 may include a silicone-based resin.

In addition, the surface-emitting laser package 100A according to the embodiment may include the diffusing part 140. The diffusing part 140 may be disposed on the surface-emitting laser device 200. The diffusing part 140 may be disposed on the housing 130. The diffusing part 140 may be supported by the housing 130. The diffusing part 140 may be placed in a recess region 142 formed on the housing 130.

The diffusing part 140 is not limited as long as it is a material that diffuses light, but in the present embodiment, glass including a diffusion material therein may be used as the diffusing part 140.

The diffusing part 140 may include a plate 141 and a pattern array 144 disposed under the plate 141. The pattern array 144 adjusts diffusion or a wide viewing angle of light emitted from a light emitting element, and may include a plurality of patterns 145. The pattern array 144 may be formed on a lower surface of the plate 141 facing the surface-emitting laser device 200. The pattern array 144 may be spaced apart from an inner surface of the housing 130.

Each pattern 145 may be formed in a hemispherical shape. The shape of each pattern 145 is not limited thereto, and may include various patterns such as a prism, a polygonal shape, and the like. A side surface of each pattern 145 may be disposed to be inclined at a predetermined angle with respect to the lower surface of the plate 141. For example, the side surface of each pattern 145 may have an inclination angle of 90 degrees or more with respect to the plate 141. When controlling the inclination angle of the side surface of each pattern 145, there is an effect that spreading property of the adhesive member 150 may be more effectively controlled.

Each pattern 145 may be formed of the same material as that of the plate 141. Alternatively, each pattern 145 may be formed of a material different from that of the plate 141. As an example, the plate 141 may include a glass material. A diffusion material may be included in the plate 141, but the embodiment is not limited thereto. Each pattern 145 may include a polymer material. Surface tension of the plate 141 may be formed greater than that of each pattern 145. Accordingly, the adhesive member 150 spreading to the lower surface of the plate 141 may prevent from spreading through the side surface of each pattern 145 due to a difference between the surface tension of the plate 141 and the surface tension of each pattern 145.

In addition, a height H of the pattern array 144 may be formed higher than that of the adhesive member 150. It is possible to prevent the adhesive member 150 from spreading below the pattern array 144 due to a height difference between the pattern array 144 and the adhesive member 150.

The height H of the pattern array 144 is formed to be larger than that of the adhesive member 150, but a ratio of the height of the pattern array 144 and the height of the adhesive member 150 may be varied depending on a size of the surface-emitting laser package 100A. In addition, a separation distance between the pattern array 144 and the inside of the housing 130 may vary depending on the size of the surface-emitting laser package 100A. Further, a width of the pattern array 144 may vary depending on the size of the surface-emitting laser package 100A.

Referring to FIG. 14, the height H of the pattern array 144, the separation distance between the pattern array 144 and the inside of the housing, and the width of the pattern array 144 according to the size of the surface-emitting laser package will be considered.

As shown in FIG. 14, the height H of the pattern array 144 may be determined by Equation 1.

$$50\ \mu m < H < (H1/2)$$ [Equation 1]

That is, the height H of the pattern array 144 may be formed to be smaller than a half value of a distance H1 between the surface-emitting laser device 200 and the diffusing part 140. In addition, the height H of the pattern array 144 may be formed to exceed at least 50 μm.

If the height H of the pattern array 144 is larger than the half value of the distance H1 between the surface-emitting laser device 200 and the diffusing part 140, since the pattern array 144 may not receive all beams emitted from the surface-emitting laser device 200, light loss may occur.

A separation distance L between the pattern array 144 and the inner surface of the housing 130 may be determined by Equation 2.

$$0 < L < (W - X1)$$ [Equation 2]

The distance L between the pattern array 144 and the inner surface of the housing 140 may be formed to be smaller than a half of each of an inner width W of the housing 130 and a width W1 of the light emitting region of the surface-emitting laser device 200. As a result, the pattern array 144 is formed only in a region necessary for beam reception, thereby effectively diffusing light.

A width X of the pattern array 144 may be larger than that of a light emission region X1 of the surface-emitting laser device 200. In detail, the width X of the pattern array 144 may be determined by Equation 3.

$$X \geq X1 + 2(H1 - H)*\tan\theta$$ [Equation 3]

Here, X refers to the width of the pattern array 144, X1 refers to a region in which light from the surface-emitting laser device 200 is emitted, H1 refers to a separation distance between the surface-emitting laser device 200 and the diffusing part 140, H refers to a height of the pattern array 144, and θ represents a viewing angle of beam emitted from the surface-emitting laser device 200. As a result, the pattern array 144 is formed only in a region necessary for beam reception, thereby effectively diffusing light.

As described above, the pattern array 144 of the present invention provides an optimum width, height, and separation distance from the housing, thereby preventing penetration of the adhesive member 150 and maximizing light efficiency.

As shown in FIG. 15, the adhesive member 150 between the housing 130 and the diffusing part 140 flows along a lower surface of the diffusing part 140 to the central region of the diffusing part 140. The adhesive member 150 flowing to the lower center region of the diffusing part 140 is in contact with a side surface of the pattern array 144, and the adhesive member 150 is no longer spread by a difference between the height of the adhesive member 150 and the height of the pattern array 144.

In addition, when the surface tension of the diffusing part 140 and the surface tension of each pattern 145 are different from each other, the spread property of the adhesive member 150 is further reduced. That is, when the surface tension of the diffusing part 140 is greater than that of each pattern 145, the spread property of the adhesive member 150 is significantly reduced. Since the diffusing part 140 may include glass including a diffusion material therein, each pattern 145 may include a polymer material. Of course, materials of the diffusing part 140 and each pattern 145 are not limited thereto.

As shown in FIG. 16, conventionally, when an adhesive member 150 penetrates into a light receiving region, a viewing angle of beam is remarkably changed, and intensity of the center region thereof is changed to a flat formation, and thus light loss has occurred.

On the other hand, in the embodiment, even though the adhesive member 150 penetrates into the inside of the housing, it does not spread to the light receiving region, and thus, it can be seen that there is almost no change in the viewing angle of the beam before and after penetration of the adhesive member 150. In addition, it can be confirmed that the intensity of the central region thereof is not changed, and thus there is no light loss.

Third Embodiment

Figure 17:
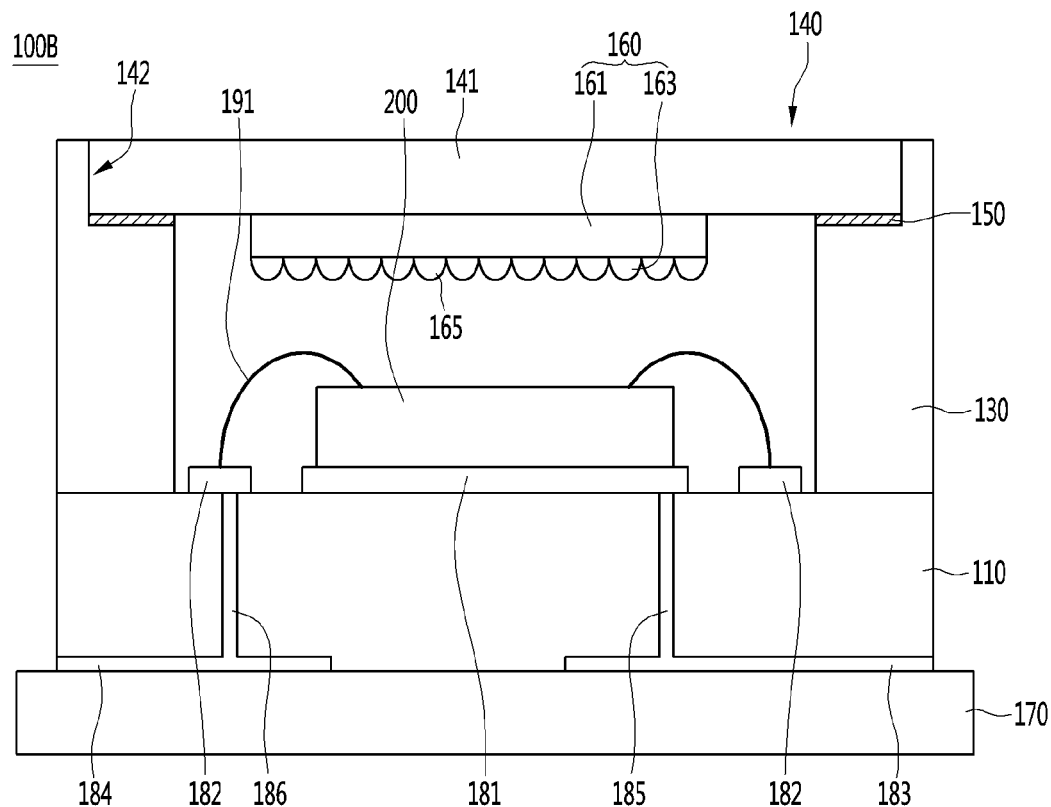
FIG. 17 is a cross-sectional view showing a surface-emitting laser package according to a third embodiment.
Figure 18:
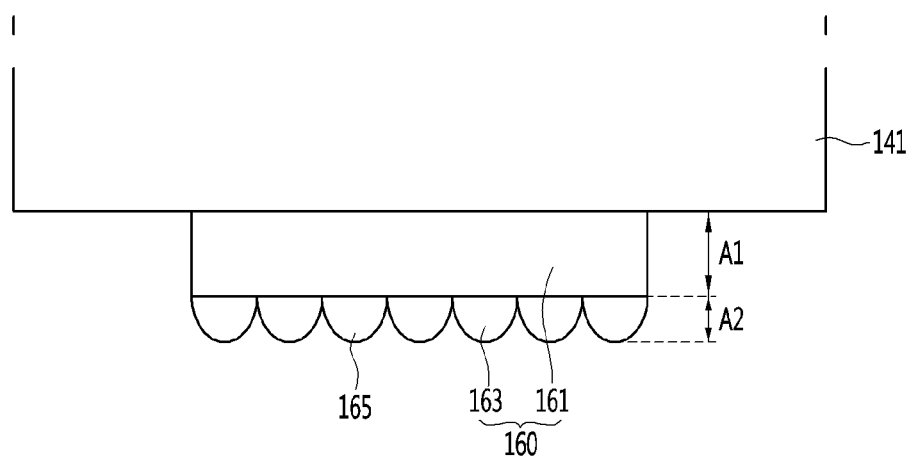
FIGS. 18 and 19 are schematic sectional views showing a diffusion pattern portion of the surface-emitting laser package according to the third embodiment.
Figure 19:
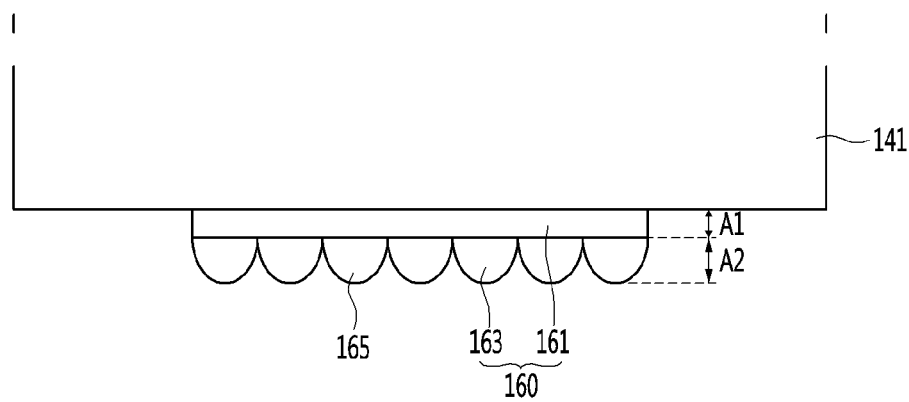

FIG. 17 is a cross-sectional view showing a surface-emitting laser package according to a third embodiment, and FIGS. 18 and 19 are schematic sectional views showing a diffusion pattern portion of the surface-emitting laser package according to the third embodiment.

The third embodiment is the same as the first and second embodiments except that the structure of the diffusing part 140 has changed. In the third embodiment, components having the same functions, structures, or shapes as those of the first and second embodiments will be designated by the same reference numerals, and detailed descriptions thereof will be omitted. The description omitted in the third embodiment may be easily understood from the first and second embodiments described above.

Referring to FIG. 17, a surface-emitting laser package 100B according to the third embodiment may include a substrate 110, a housing 130, a surface-emitting laser device 200, and a diffusing part 140. The diffusing part 140 of the embodiment may include a first plate 141 and a diffusion pattern portion 160 disposed on one side of the first plate 141.

The diffusion pattern portion 160 of the embodiment may include a second plate 161 disposed under the first plate 141 and a pattern array 163 disposed under the second plate 161. The second plate 161 may be disposed in a lower center region of the first plate 141. That is, a size of the second plate 161 may be smaller than that of the first plate 141. In detail, a lower surface of the first plate 141 may have a central region and an edge region surrounding the central region. The central region may be referred to as a first region, and the edge region may be referred to as a second region. In this case, the second plate 161 may be disposed to correspond to the first region of the first plate 141, and the pattern array 163 may be disposed on a lower surface of the second plate 161. The second plate 161 may be formed of a material different from that of the first plate 141. The surface tension of the second plate 161 may be formed to be different from the surface tension of the first plate 141. Preferably, the surface tension of the first plate 141 may be greater than the surface tension of the second plate 161. The first plate 141 may be formed of glass including a diffusion material therein. The second plate 161 may include a polymer material. Alternatively, the second plate 161 may be formed of the same material as that of the first plate 141.

The second plate 161 may be formed such that a side surface thereof is perpendicular to the lower surface of the first plate 141. From this, an adhesive member 150 flowing under the first plate 141 stays on the side surface of the second plate 161, so that it no longer spreads.

The pattern array 163 may include a plurality of patterns 165. Each pattern 165 may include a hemisphere, a prism, and a polygonal shape. The shape of each pattern 165 is not limited thereto. Each pattern 165 may effectively control diffusion and a viewing angle of light incident to the diffusing part 140. Each pattern 165 may be formed of the same material as that of the second plate 161. Alternatively, each pattern 165 may be formed of a material different from that of the second plate 161. Since the second plate 161 is formed to have surface tension different from that of the first plate 141, each pattern 165 may perform only diffusion and control of light. From this, each pattern 165 may be formed of various materials regardless of surface tension with the first plate 141.

Alternatively, the second plate 161 may be formed of the same material as that of the first plate 141, and each pattern 165 may be formed of a different material from that of the second plate 161. The first plate 141 and the second plate 161 may include glass including a diffusion material, and each pattern 165 may include a polymer.

As shown in FIG. 18, a height A1 of the second plate 161 may be formed greater than a height A2 of each pattern 165. In this case, the side surface of the second plate 161 perpendicular to the lower surface of the first plate 141 is lengthened, thereby effectively preventing entry of the adhesive member 150.

As shown in FIG. 19, the height A1 of the second plate 161 may be formed smaller than the height A2 of each pattern 165. In this case, there is an effect that the viewing angle of light may be more effectively controlled by forming the height A2 of each pattern 165 large.

Fourth Embodiment

Figure 20:
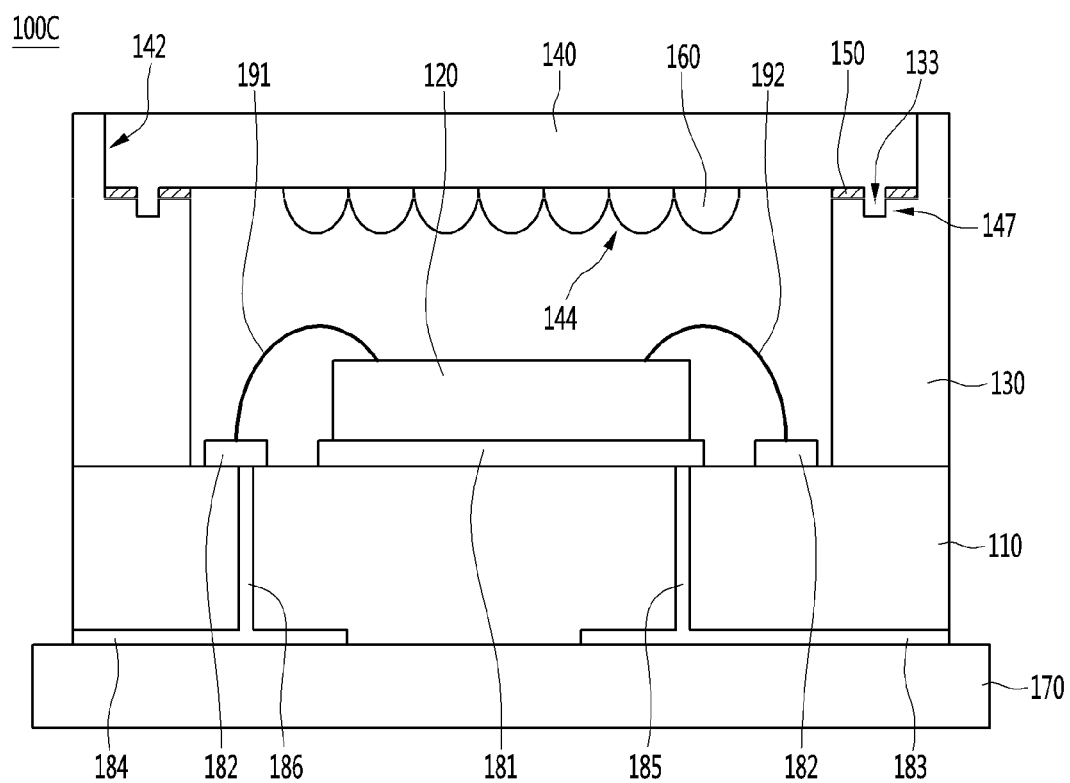
FIG. 20 is a cross-sectional view showing a surface-emitting laser package according to a fourth embodiment.
Figure 21:
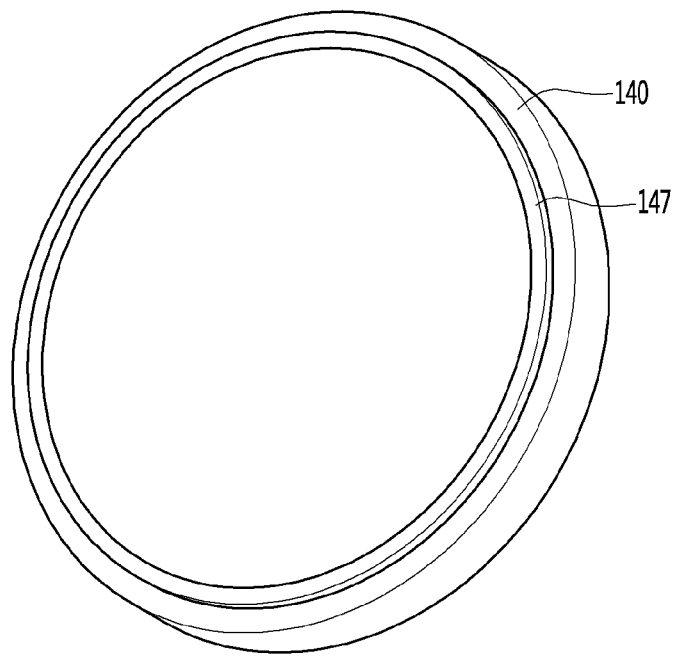
FIG. 21 is a cross-sectional view showing a diffusing part of the surface-emitting laser according to the fourth embodiment.

FIG. 20 is a cross-sectional view showing a surface-emitting laser package according to a fourth embodiment, and FIG. 21 is a cross-sectional view showing a diffusing part of the surface-emitting laser according to the fourth embodiment.

The fourth embodiment is the same as the first embodiment except that the structure of the diffusing part 140 has changed. In the fourth embodiment, components having the same functions, structures, or shapes as those of the first embodiment will be designated by the same reference numerals, and detailed descriptions thereof will be omitted. The description omitted in the fourth embodiment may be easily understood from the first embodiment described above.

Referring to FIG. 20, a surface-emitting laser package 100C according to the fourth embodiment may include a substrate 110, a housing 130, a surface-emitting laser device 200, and a diffusing part 140.

The diffusing part 140 may be disposed in a recess region 142 at an upper portion of the housing 130. A side surface of the diffusing part 140 may be in contact with a side surface of the recess region 142 of the housing 130. An edge region of a lower surface of the diffusing part 140 may be in contact with an upper surface of the housing 130. An adhesive member 150 may be disposed between the lower surface of the diffusing part 140 and the upper surface of the housing 130. The adhesive member 150 may be further disposed between the side surface of the diffusing part 140 and a side surface of the housing 130.

The lower surface of the edge of the diffusing part 140 may further include a protrusion 147 protruding downward of the diffusing part 140. The protrusion 147 may protrude along a downward direction from the lower surface of the diffusing part 140. For example, the protrusion has a square shape when viewed from the side, but the embodiment is not limited thereto. The protrusion 147 may be disposed to correspond to the recess region 142 of the housing 130. A groove 133 corresponding to the protrusion 147 may be disposed in the recess region 142 of the housing 130. The groove 133 may be disposed on an upper surface of the recess region 142 of the housing 130.

The protrusion 147 of the diffusing part 140 is coupled to the groove 133 formed in the housing 130, and thus the adhesive member 150 may be suppressed from flowing on the lower surface of the diffusion part 140. In order to more effectively prevent the flow of the adhesive member 150, a height of the protrusion 147 may be formed higher than a height of the adhesive member 150. In addition, the protrusion 147 of the diffusing part 140 is coupled to the groove 133 formed in the housing 130, and thus the diffusing part 140 may be securely fixed to the housing 130.

As shown in FIG. 21, the protrusion 147 may be formed in a circular belt shape along the lower surface of the diffusion 1 part 140. Alternatively, the protrusion 147 may be formed to be divided into a plurality of pieces.

In the above description, the protrusion 147 is formed in the lower portion of the diffusing part, and the groove 133 is formed on the upper surface of the housing, but the present embodiment is not limited thereto. A protrusion may be formed on the upper surface of the housing, and a groove may be formed on the lower surface of the diffusing part corresponding thereto.

Meanwhile, the surface-emitting laser packages 100 according to the embodiments described above may be applied to proximity sensors, autofocusing devices, and the like. For example, the autofocusing device according to the embodiment may include a light emitting unit that emits light and a light receiving unit that receives light. At least one of the surface-emitting laser packages 100 according to the first to fourth embodiments described with reference to FIGS. 1 to 18 may be applied as an example of the light emitting unit. As an example of the light receiving unit, a photodiode may be applied. The light receiving unit may receive light reflected from an object by the light emitted from the light emitting unit.

The autofocusing device may be applied to a variety of applications such as a mobile terminal, a camera, a vehicle sensor, and an optical communication device. The autofocusing device may be applied to various fields for multi-position detection for detecting the position of a subject.

Figure 22:
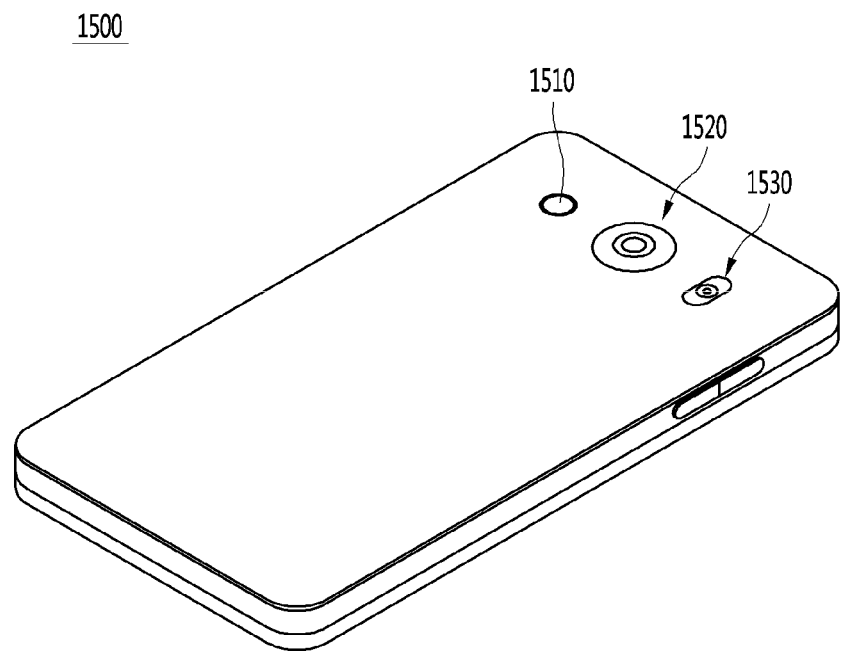
FIG. 22 is a perspective view of a mobile terminal to which an autofocusing device including a surface-emitting laser package according to an embodiment is applied.

FIG. 22 is a perspective view of a mobile terminal to which an autofocusing device including a surface-emitting laser package according to an embodiment is applied.

As shown in FIG. 22, a mobile terminal 1500 of an embodiment may include a camera module 1520, a flash module 1530, and an autofocusing device 1510 provided on a rear surface thereof.

The flash module 1530 may include a light emitting element that emits light therein. The flash module 1530 may be operated by the camera operation of the mobile terminal or by the user's control. The camera module 1520 may include an image photographing function and an autofocus function. For example, the camera module 1520 may include an autofocus function using an image.

The autofocusing device 1510 may include an autofocusing function using a laser. The autofocusing device 1510 may be used under the condition that the autofocus function using the image of the camera module 1520 is deteriorated, for example, may be used mainly in a close-up of 10 m or less or dark environment. The autofocusing device 1510 may include a light emitting unit including the surface-emitting laser device and a light receiving unit that converts light energy into electrical energy such as a photodiode.

The above detailed description should not be construed as limiting in all respects, and should be considered as illustrative. The scope of the embodiment should be determined by reasonable interpretation of the appended claims, and all modifications within the equivalent scope of the embodiment is included in the scope of the embodiment.

Embodiments may be used in optical communications, sensors, autofocusing devices, proximity sensors, autofocusing devices, and the like.

The invention claimed is:

1. A surface-emitting laser package comprising:
   a substrate;
   a surface-emitting laser device disposed on the substrate and having a non-light emitting region and a light emitting region including a plurality of emitters generating a first laser beam, respectively;
   a housing disposed around the surface-emitting laser device; and
   a diffusing part disposed on the surface-emitting laser device,
   wherein the light emitting region has a first width in a first direction and a second width in a second direction perpendicular to the first direction,
   wherein the second width is larger than the first width,
   wherein the diffusing part outputs the first laser beam as a second laser beam having a first viewing angle in the first direction and a second viewing angle in the second direction,
   wherein the first viewing angle is larger than the second viewing angle,
   wherein the diffusing part includes a plate and a pattern array disposed under the plate facing the surface-emitting laser device, and
   wherein the pattern array includes a plurality of patterns having a short axis in the first direction and a long axis in the second direction.

2. The surface-emitting laser package of claim 1, wherein the light emitting region of the surface-emitting laser device has a rectangular shape in which the second width is larger than the first width.

3. The surface-emitting laser package of claim 1, wherein the second laser beam has a rectangular shape in which the first viewing angle is larger than the second viewing angle.

4. The surface-emitting laser package of claim 1, wherein the diffusing part has a square shape in which each of a first width of the diffusing part in the first direction and a second width of the diffusing part in the second direction is larger than at least a least the second width of the light emitting region of the surface-emitting laser device.

5. The surface-emitting laser package of claim 1, wherein an emission angle in the first direction is larger than an emission angle in the second direction in the second laser beam.

6. A surface-emitting laser package comprising:
   a substrate;
   a surface-emitting laser device disposed on the substrate and having a non-light emitting region and a light emitting region including a plurality of emitters generating a first laser beam, respectively;
   a housing disposed around the surface-emitting laser device; and a diffusing part disposed on the surface-emitting laser device, wherein the light emitting region has a first width in a first direction and a second width in a second direction perpendicular to the first direction, wherein the second width is larger than the first width, wherein the diffusing part outputs the first laser beam as a second laser beam having a first viewing angle in the first direction and a second viewing angle in the second direction, and wherein the first viewing angle is larger than the second viewing angle, wherein the second laser beam has a rectangular shape in which the first viewing angle is larger than the second viewing angle, and wherein the first viewing angle is 10° to 20° larger than the second viewing angle.

7. A surface-emitting laser package comprising:

a substrate;

a surface-emitting laser device disposed on the substrate;

a housing disposed on the substrate and disposed around the surface-emitting laser device;

a first plate disposed on the housing and spaced apart from the surface-emitting laser device;

an adhesive member disposed between the housing and the first plate; and a pattern array disposed on one side of the first plate facing the surface-emitting laser device, wherein the pattern array is disposed to be spaced apart from an inner surface of the housing, wherein a height of the pattern array is formed to be smaller than a half value of a distance between the surface-emitting laser device and a diffusing part, wherein a width of the pattern array is larger than a light emitting region of the surface-emitting laser device, wherein a separation distance between the pattern array and the inner surface of the housing is smaller than a half of difference between an inner width of the housing and a width of the light emitting region of the surface-emitting laser device, and wherein a width of the pattern array is determined by a following equation:

$$X \geq X1 + 2(H1-H)*\tan\theta,$$

where X represents the width of the pattern array, X1 refers to a region in which light is emitted from the surface-emitting laser device, H1 represents a separation distance between the surface-emitting laser device and the diffusing part, H represents a height of the pattern array, and θ represents a viewing angle of beam emitted from the surface-emitting laser device.

8. The surface-emitting laser package of claim 7, wherein the height of the pattern array exceeds 50 μm.

9. The surface-emitting laser package of claim 7, further comprising a second plate disposed between the first plate and the pattern array, wherein a size of the second plate is smaller than that of the first plate.

10. The surface-emitting laser package of claim 9, wherein a height of the second plate and a height of a pattern portion of the pattern array are different from each other.

11. The surface-emitting laser package of claim 9, wherein a surface tension of the first plate is greater than a surface tension of the second plate.

12. The surface-emitting laser package of claim 7, wherein the diffusing part includes a protrusion disposed at an edge thereof, and wherein the protrusion of the diffusing part is inserted into the housing.

13. The surface-emitting laser package of claim 12, wherein the housing has a recess region in an upper region thereof, and wherein a bottom surface of the recess region has a groove corresponding to the protrusion.

14. The surface-emitting laser package of claim 13, wherein the adhesive member is disposed on the bottom surface of the recess region, and wherein the adhesive member includes a hole corresponding to the groove.

15. The surface-emitting laser package of claim 13, wherein a height of the protrusion of the diffusing part is larger than a height of the adhesive member.

* * * * *